(12) United States Patent
Evans

(10) Patent No.: US 10,958,286 B2
(45) Date of Patent: Mar. 23, 2021

(54) COMPRESSION AND DECOMPRESSION OF FIXED LENGTH DATA STRUCTURES

(71) Applicant: European Space Agency, Paris (FR)

(72) Inventor: David Evans, AG Noordwijk (NL)

(73) Assignee: European Space Agency, Paris (FR)

(*) Notice: Subject to any disclaimer, the term of this patent is extended or adjusted under 35 U.S.C. 154(b) by 0 days.

(21) Appl. No.: 16/794,975

(22) Filed: Feb. 19, 2020

(65) Prior Publication Data

US 2020/0266829 A1 Aug. 20, 2020

(30) Foreign Application Priority Data

Feb. 20, 2019 (EP) ..................................... 19158412

(51) Int. Cl.
*H03M 7/00* (2006.01)
*H03M 7/30* (2006.01)
*H04L 29/06* (2006.01)

(52) U.S. Cl.
CPC ....... *H03M 7/3066* (2013.01); *H03M 7/6011* (2013.01); *H04L 69/04* (2013.01)

(58) Field of Classification Search
CPC .... H03M 7/3066; H03M 7/6011; H03M 7/00; H04L 69/04
USPC ..................................................... 341/50, 51
See application file for complete search history.

(56) References Cited

U.S. PATENT DOCUMENTS

| | | | | |
|---|---|---|---|---|
| 4,115,768 A | * | 9/1978 | Eggenberger | H03M 7/00 341/59 |
| 8,885,477 B2 | * | 11/2014 | Evans | H03M 7/3066 370/235 |
| 9,218,319 B2 | * | 12/2015 | Cameron | H03M 7/00 |
| 9,307,444 B2 | * | 4/2016 | Wang | H04L 69/04 |
| 2004/0113820 A1 | * | 6/2004 | Leanza | H03M 7/4006 341/50 |
| 2007/0276985 A1 | * | 11/2007 | Schuessler | G06K 7/0008 711/100 |

(Continued)

FOREIGN PATENT DOCUMENTS

| | | |
|---|---|---|
| WO | 2013/029646 A1 | 3/2013 |
| WO | 2018/145730 A1 | 8/2018 |

OTHER PUBLICATIONS

Extended European Search Report for Application No. 19158412.7, dated Sep. 6, 2019, 7 pages.

*Primary Examiner* — Jean B Jeanglaude
(74) *Attorney, Agent, or Firm* — Seed Intellectual Property Law Group LLP

(57) ABSTRACT

A method of encoding fixed length data bit strings includes receiving and sequentially encoding a sequence of data bit strings. For a data bit string immediately following a preceding data bit string, this includes obtaining a reference bit string, and a mask bit string and a tracking bit string as present at the end of a previous encoding of the preceding data bit string, identifying bits that differ form corresponding bits in the reference bit string, determining, as unpredictable bits, all those bits in the data bit string that are indicated as not predictable by the mask bit string and are not in bit positions indicated by the tracking bit string, generating a sequence of position indicators, generating an encoded data packet that includes representations of values of the unpredictable bits and the sequence of positon indicators, and periodically updating the mask bit string and the tracking bit string.

19 Claims, 11 Drawing Sheets

(56) References Cited

U.S. PATENT DOCUMENTS

| | | | |
|---|---|---|---|
| 2013/0103891 A1* | 4/2013 | Sharon | G06F 12/0246 |
| | | | 711/103 |
| 2014/0269317 A1* | 9/2014 | Wang | H04L 69/04 |
| | | | 370/235 |
| 2016/0020782 A1* | 1/2016 | Ruff | H03M 7/30 |
| | | | 341/95 |

* cited by examiner

COMPRESSION AND DECOMPRESSION OF FIXED LENGTH DATA STRUCTURES

BACKGROUND

Technical Field

This application relates to encoding (e.g., compression) and decoding (e.g., decompression) of sequences of fixed length data structures. The fixed length data structures may be data items of time series data, such as telemetry data from a remote system, for example. The remote system may be a spacecraft, such as a satellite, or a system aboard a spacecraft, for example.

Description of the Related Art

Jointly owned application WO 2018/145730 A1 relates to the compression and decompression of repeating fixed-length data structures (e.g., housekeeping/telemetry packet or line of an image). It describes an automatic process that categorizes all the bits in any repeating fixed length data structure into either being predictable or non-predictable. The sense of being predictable here is that those bits have a high probability of being in the same state as those in a reference data set. This reference data set is itself updated automatically. Non-predictable bits are masked out of the data structure using a bit mask and the data structure is XORed with the reference data set to identify any bits where the predication was wrong. Whenever a predictable bit prediction is wrong, its corresponding bit is added to the bit mask (called a negative update of the bit mask). On the other hand, if a non-predictable bit does not change status for a certain number of cycles then its corresponding bit position is removed from the bit mask (called a positive update of the bit mask). The compressed packet comprises indications of the positive and negative updates to the bit mask plus the states of the non-predictable bits, which are sent in the clear.

However, the above technique does not perform well for sequences of fixed length data structures in which certain bits transition frequently from predictable to non-predictable, and vice versa, which leads to reduced compression efficiency. Moreover, the data rate for such sequences of fixed length may feature rather prominent peaks, which may be undesirable.

Thus, there is a need for an improved technique for compressing and decompressing sequences of fixed length data structures. There is particular need for such technique that improves compression efficiency and/or equalizes the data rate.

BRIEF SUMMARY

In view of some or all of these needs, the present disclosure proposes a method of encoding fixed length data bit strings, a method of decoding encoded fixed length data bit strings, and corresponding apparatus and computer-readable storage media, having the features of the respective independent claims.

An aspect of the disclosure relates to a method of encoding fixed length data bit strings. The fixed length data bit strings may relate to time series data, for example. The method may include receiving a sequence of data bit strings (e.g., of time series data). The data bit strings may have equal length (i.e., fixed length). The method may further include sequentially encoding the data bit strings. Sequentially encoding the data bit strings may include periodically updating a mask bit string and a tracking bit string. Updates may also be performed on request or on occurrence of a respective trigger. The mask bit string and the tracking bit string may be synchronously updated, i.e., for the same data bit string. The mask bit string may be indicative of which bits in the data bit strings are predictable and which bits in the data bit string are not predictable. Predictable bits may be bits that are expected to be identical to corresponding bits in a reference bit string for the data bit string. Unpredictable bits may be bits that are not expected to be identical to corresponding bits in the reference bit string. The tracking bit string may be indicative of which bits in the mask bit string have recently changed. The length of the data bit strings may also determine the lengths of the reference bit string, the mask bit string, and the tracking bit string (e.g., these lengths may be equal to the length of the data bit strings). Sequentially encoding the data bit strings may further include, for a data bit string among the sequence of data bit strings, obtaining the mask bit string and the tracking bit string. Sequentially encoding the data bit strings may further include obtaining the reference bit string for the data bit string. Sequentially encoding the data bit strings may further include identifying bits in the data bit string that differ from corresponding bits in the reference bit string. This may involve comparing the data bit string to the reference bit string (e.g., by means of an XOR operation). Sequentially encoding the data bit strings may further include determining, as unpredictable bits, all those bits in the data bit string that are indicated as not predictable by the mask bit string and that are not in bit positions indicated by the tracking bit string. Bits indicated by the tracking bit string may be understood to be those bits whose bit positions are indicated by the tracking bit string. Bit positions indicated by the tracking bit string may be those bit positions for which corresponding bits in the tracking bit string are set to a value (e.g., "1") indicating a recent change in the mask bit string. Sequentially encoding the data bit strings may further include generating, for those bits among the identified bits that are not among the unpredictable bits, a sequence of position indicators. Each position indicator may indicate a bit position of a respective bit with respect to a bit position indicated by the preceding position indicator in the sequence of position indicators. To this end, each position indicator may include a counter (count value). A first position indicator in the sequence of position indicators may indicate the bit position with respect to an initial bit position, in a predetermined scan order, in the data bit string (e.g., with respect to the LSB position). Position indicators that indicate bit positions of respective bits that are indicated by the tracking bit string may encode the bit position with reference to the tracking bit string (e.g., in terms of a number of set bits in the tracking bit string between the relevant two bit positions). Sequentially encoding the data bit strings may yet further include generating an encoded data packet for the data bit string. The encoded data packet may include a representation of values of the unpredictable bits and a representation of the sequence of position indicators.

The tracking bit string captures recent transitions between predictable and not predictable bits ("transitioned bits"), i.e., keeps track of those bits (bit positions) for which there has been a recent update to the mask bit string. These bits are most likely to transition back to their original state in the short term. Grouping these bits means they can be compressed effectively even if they have a higher probability of being set than the other bits. This is achieved by using a different counter for coding the bit positions of the "transition bits". Since their bit positions are coded with reference to the tracking bit string, e.g., in term of a number of set bits in the tracking bit string between respective bit positions, they can be coded by significantly smaller numbers (count values) than the counters for the remaining bits. Thereby, the compression performance can be improved over known techniques. Since this improvement is particularly large for data bit strings that do not compress well by known techniques, this contributes to leveling the peak data rate of the encoded/compressed fixed length data bit strings.

In some embodiments, the sequence of position indicators may include first-type position indicators relating to the bits among the identified bits that are indicated by the tracking bit string. The sequence of position indicators may further include second-type position indicators relating to bits among the identified bits that are not indicated by the tracking bit string. The first-type position indicators may indicate respective bit positions in terms of a number of set bits in the tracking bit string located between the bit position indicated by the preceding position indicator in the sequence of position indicators and the respective bit position. The second-type position indicators may indicate respective bit positions in terms of a number of bit positions located between the bit position indicated by the preceding position indicator in the sequence of position indicators and the respective bit position. Each position indicator may include a label identifying the respective position indicator to be either a first-type position indicator or not a first-type position indicator. Further, each position indicator may include a count value. The count value of first-type position indicators may relate to a number of set bits in the tracking bit string, whereas the count value of second-type position indicators may relate to a number of bit positions in the respective bit string that is traversed. The number of set bits in the tracking bit string may include the set bit at the bit position indicated by the respective first-type position indicator.

Since the tracking bit string typically is sparse, the first type position indicators can encode large distances between bit positions in a bit string using a very small count value. Also, no counters are needed to indicate when a bit transitions out of the tracking bit string and is re-classed as predictable, since this information can be derived at the decoder side by the absence of counters. In fact, many bits behave like this (i.e., they are predictable for most tracking cycles but occasionally transition into the tracking bit string for a single cycle and then become predictable again). The combination of these factors implies that compression efficiency is significantly improved and large variations in compression performance are reduced.

In some embodiments, the method may further include maintaining a mask update bit string. The mask update bit string may indicate, for a current period (or cycle), all bits in the data bit strings encoded during that period that have been identified as bits that differ from corresponding bits in the respective reference bit strings. Each period/cycle may include processing of a (predetermined) number of data bit strings. Accordingly, the mask update bit string may aggregate all those bits (bit positions) for which there has been a change from the reference bit string to the respective data bit string (e.g., a change from one data bit string to the next data bit string in the sequence) during the current period. The mask bit string may be reset after an update of the mask bit string has been performed.

By keeping track of bits that have changed from their reference values during a period, the mask update bit string enables updating the mask bit string when an update is required, either periodically or on demand.

In some embodiments, the method may further include, when updating the mask bit string, generating, as part of the sequence of position indicators, one or more third-type position indicators. Each third-type position indicator may indicate a respective bit within the data bit string that is indicated by the mask bit string and that is not indicated by any of the mask update bit string or the tracking bit string. The method may further include, when updating the mask bit string, setting the mask bit string to the mask update bit string. The mask bit string may also be updated on request, in addition to the periodic updates, or on occurrence of any other appropriate trigger.

On ground (i.e., at the decoder/decompression side), the third-type position indictors can be distinguished from the second-type position indicators by noting that third-type position indicators are those position indicators that are not labelled as first-type position indicators and that indicate a bit position that is also indicated by the ground mask (i.e., the mask bit string that is maintained at the decoder side). The third-type position indicators signal positive updates of the mask bit string to the decoder side. They can be readily distinguished from second-type position indicators, since the bit positions indicated by the third-type position indicators are also indicated (covered) by the mask bit string at the decoder side.

In some embodiments, the method may further include, when updating the tracking bit string, setting the tracking bit string to indicate all those bits that are indicated by the mask bit string but not indicated by the mask update bit string, and to indicate all those bits that are indicated by the mask update bit string but not indicated by the mask bit string. Thereby, the tracking bit string can keep track of recent changes of the mask bit string.

In some embodiments, the reference bit string may be that data bit string in the sequence of data bit strings that immediately precedes the presently processed/encoded data bit string. That is, encoding may be said to proceed in chain mode. By using the immediately preceding data bit string as the reference bit string, it can be ensured that an appropriate reference bit string is available for all data bit strings, with on average small differences between data bit string and their respective reference bit strings.

In some embodiments, the method may further include updating the tracking bit string to also indicate bit positions of the identified bits in the data bit string that differ from corresponding bits in the reference bit string and are not indicated by the mask bit string. That is, the tracking bit string may aggregate, during a given period, all those bits (bit positions) for which there has been a change from one data bit string to the next data bit string in the sequence during that period and which were previously classed as predictable (e.g., relating to second-type position indicators). Including these bits into the tracking bit string increases the number of bit positions that can be encoded with first-type position indicators and moreover renders continuous updates of the mask bit string unnecessary.

Another aspect of the disclosure relates to a method of sequentially decoding a plurality of encoded data packets into corresponding decoded (fixed length) data bit strings. For example, the method may relate to decoding time series data by sequentially decoding a plurality of encoded data packets of time series data into corresponding decoded (fixed length) data bit strings of time series data. Sequentially decoding the encoded data packets may include periodically updating a mask bit string and periodically updating a tracking bit string. Updates may also be performed on request or on occurrence of a respective trigger. The mask bit string and the tracking bit string may be synchronously updated, i.e., for the same encoded data packet. The mask bit string may also (additionally) be continuously updated in some implementations. The mask bit string may be indicative of which bits in the data bit strings are predictable and which bits in the data bit string are not predictable. The tracking bit string may be indicative of which bits in the mask bit string have recently changed. Each encoded data packet may include a representation of values of unpredictable bits in the respective data bit string and a representation of a sequence of position indicators. The unpredictable bits may be all those bits in the respective data bit string that are indicated as not predictable by the mask bit string and that are not in bit positions indicated by the tracking bit string. The position indicators may indicate bit positions of difference bits in the respective data bit string that differ from corresponding bits in a reference bit string for the respective data bit string. Each position indicator may indicate a bit position of a respective difference bit with respect to a bit position indicated by the preceding position indicator in the sequence of position indicators. Position indicators that indicate bit positions of respective difference bits that are indicated by the tracking bit string may encode the bit position with reference to the tracking bit string. Sequentially decoding the encoded data packets may further include, for an encoded data packet, obtaining the reference bit string, the mask bit string, and the tracking bit string for the encoded data packet. Sequentially decoding the encoded data packets may further include decoding/extracting the sequence of position indicators from the encoded data packet. Sequentially decoding the encoded data packets may further include decoding/extracting the values of the unpredictable bits from the encoded data packet. Sequentially decoding the encoded data packets may further include setting the data bit string to be identical to the reference bit string. Sequentially decoding the encoded data packets may further include inverting all those bits in the data bit string that are indicated by the position indicators in the sequence of position indicators but not indicated by any of the mask bit string or the tracking bit string. Sequentially decoding the encoded data packets may further include inverting all those bits in the data bit string that are indicated by the position indicators in the sequence of position indicators and indicated by the tracking bit string. Bits in the data bit string may be inverted only if they are indicated by first-type position indicators or second-type position indicators (defined below), but not if they are indicated by third-type position indicators (defined below). Sequentially decoding the encoded data packets may further include inserting the values of the unpredictable bits in sequence into the data bit string in respective bit positions indicated by the mask bit string but not indicated by the tracking bit string, unless these bit positions are indicated by position indicators in the sequence of position indicators. Bits in respective bit positions of the data bit string may be replaced by the values of respective unpredictable bits. Sequentially decoding the encoded data packets may yet further include outputting the (reconstructed) data bit string.

Using this method, the relevant bit strings at the decoder side can be maintained to reflect their respective counterparts at the encoder side and the data bits strings can be effectively reconstructed.

In some embodiments, the sequence of position indicators may include first-type position indicators relating to the bits among the difference bits that are indicated by the tracking bit string. The sequence of position indicators may further include second-type position indicators relating to bits among the difference bits that are not indicated by the tracking bit string. The first-type position indicators may indicate respective bit positions in terms of a number of set bits in the tracking bit string located between the bit position indicated by the preceding position indicator in the sequence of position indicators and the respective bit position. Each position indicator may include a label identifying the respective position indicator to be either a first-type position indicator or not a first-type position indicator. Each position indicator may include a counter (count value). The number of set bits in the tracking bit string may include the set bit at the bit position indicated by the respective first-type position indicator.

In some embodiments, the method may further include updating the mask bit string to further indicate as not predictable all those bits whose bit positions are indicated by any of the first-type and second-type type position indicators. The mask bit string may also be updated to indicate as predictable all those bits whose bit positions are indicated by third-type position indicators. The typically larger computational resources at the decoder side can be used to perform continuous updates of the mask bit string at the decoder side. The position indicators provided by the encoder side are fully sufficient for this task.

In some embodiments, the method may further include maintaining a mask update bit string that indicates, for a current period/cycle, all bits in the data bit strings decoded during that period that have been identified as bits that differ from corresponding bits in the respective reference bit strings. The mask update bit string may aggregate all those bits (bit positions) for which there has been a change from the reference bit string to the respective data bit string (e.g., a change from one data bit string to the next data bit string in the sequence).

In some embodiments, the method may further include, when updating (e.g., periodically updating) the mask bit string, setting the mask bit string to the mask update bit string. After that, the mask update bit string may be reset.

In some embodiments, the sequence of position indicators may further include, when an update (e.g., periodic update) of the mask bit string should be performed, one or more third-type position indicators. Each third-type position indicator may indicate a respective bit position that is also indicated by the mask bit string but is not indicated by the tracking bit string. The method may further include updating the mask bit string to indicate all those bits as predictable that are indicated by the third-type position indicators. The need for an update (e.g., periodic update) can be indicated by a set flag in the encoded data packet. In decoding, the third-type position indictors can be distinguished from the second-type position indicators by noting that third-type position indicators are those position indicators that are not labelled as first-type position indicators and that indicate a bit position that is also indicated by the (e.g., constantly updated) mask at the decoder side.

In some embodiments, the method may further include, when an update (e.g., periodic update) of the mask bit string should be performed, updating the mask bit string to indicate all those bits as not predictable that are in bit positions indicated by any first-type position indicators or second-type position indicators that have been decoded since the last periodic update of the mask bit string. The method may further include, when the update (e.g., periodic update) of the mask bit string should be performed, updating the mask bit string to indicate all those bits as predictable that are in bit positions indicated by any third-type position indicators that have been decoded since the last periodic update of the mask bit string. The method may yet further include, when the update (e.g., periodic update) of the mask bit string should be performed, updating the mask bit string to indicate all those bits as predictable that are in bit positions indicated in the tracking bit string but not indicated by any first-type position indicators or second-type position indicators that have been decoded since the last update (e.g., periodic update) of the mask bit string.

In some embodiments, the method may further include, when updating (e.g., periodically updating) the tracking bit string, setting the tracking bit string to indicate all those bits that are indicated by the mask bit string but not indicated by the mask update bit string, and to indicate all those bits that are indicated by the mask update bit string but not indicated by the mask bit string. This may be referred to as a first method for updating the tracking bit string.

In some embodiments, the method may further include, before updating (e.g., periodically updating) the mask bit string, saving the current mask bit string as a reference mask bit string. The method may further include, when updating (e.g., periodically updating) the tracking bit string, comparing the updated mask bit string to the reference mask bit string and generating the updated tracking bit string to indicate those bits in the updated mask bit string that differ from corresponding bits in the reference mask bit string as bits in the mask bit string that have recently changed. This may be referred to as a second method for updating the tracking bit string.

In some embodiments, the reference bit string for a given encoded data packet may be the data bit string that has been last decoded. That is, decoding the encoded data packets may proceed in chain mode.

In some embodiments, the method may further include updating the tracking bit string to also indicate bit positions of the difference bits in the data bit string that differ from corresponding bits in the reference bit string. That is, the tracking bit string may aggregate, during a given period, all those bits (bit positions) for which there has been a change from one data bit string to the next data bit string in the sequence during that period.

In some embodiments, the method may further include updating the tracking bit string to further indicate all those bits whose bit positions are indicated by those position indicators that do not encode the bit position with reference to the tracking bit string. These position indicators (e.g., second-type position indicators) may just indicate a total number of bits between the bit position and the bit position indicated by the preceding position indicator.

Another aspect of the disclosure relates to an apparatus comprising a processor and a memory coupled to the processor. The processor may be configured to perform the method of any of the above aspects and their embodiments. That is, the apparatus may serve as either one of an encoder or a decoder, for example.

Another aspect of the disclosure relates to a computer-readable storage medium containing instructions for execution by a processor that cause the processor to perform the method of any of the above aspects and their embodiments.

It will be appreciated that method steps and apparatus features may be interchanged in many ways. In particular, the details of the disclosed method can be realized by the corresponding apparatus, and vice versa, as the skilled person will appreciate. Moreover, any of the above statements made with respect to the methods are understood to likewise apply to the corresponding apparatus, and vice versa.

It will further be appreciated that the method of decoding mirrors the method of encoding and that respective statements made with respect to either method also hold for the respective other method.

BRIEF DESCRIPTION OF THE SEVERAL VIEWS OF THE DRAWINGS

Example embodiments of the disclosure are explained below with reference to the accompanying drawings, wherein.

DETAILED DESCRIPTION

Figure 1:
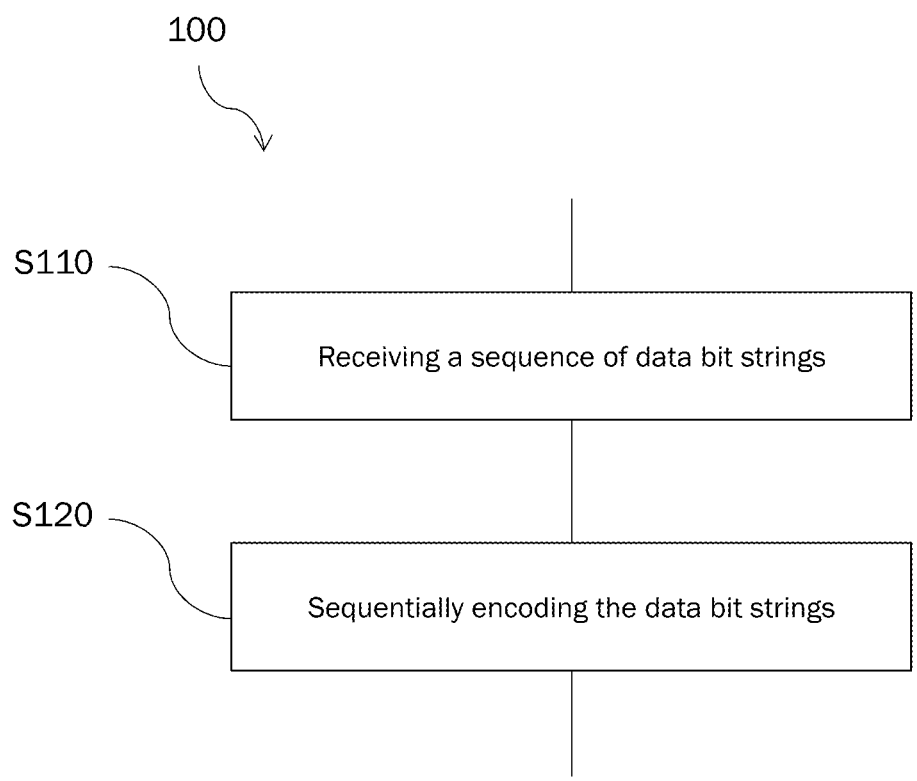
FIG. 1 illustrates, in flowchart form, an example of method of encoding fixed length data bit strings according to embodiments of the disclosure.

In the following, example embodiments of the disclosure will be described with reference to the appended figures. Identical elements in the figures may be indicated by identical reference numbers, and repeated description thereof may be omitted.

Broadly speaking, this disclosure describes a method of losslessly compressing and decompressing repeating fixed length data structures (e.g., packets of time series data) using very little CPU power and on an individual basis. That is, each instance of a data structure is compressed and decompressed on its own rather than having to wait for a complete group of such structures to be available. These methods are therefore applicable to real-time compression and decompression of data as well as to that of the more traditional stored data target, i.e., the same process can be used for either. Since it uses very little CPU it can be deployed on low power processors such as those used in spacecraft, for example, or other remote systems.

An important technical characteristic of methods according to embodiments of the disclosure is a major adaptation of the technique disclosed in WO 2018/145730 A1. Namely, the present disclosure introduces the idea of a third status/classification (apart from masked/non-predictable and unmasked/predictable), called "recently transitioned". This third status applies to bits in the fixed length data structures that have transitioned from predictable to non-predictable (or vice versa) in a configurable history span (e.g., referred to as period/cycle).

According to embodiments of the disclosure, an automatic process determines the recently transitioned bits. These are then removed from the normal processes in WO 2018/145730 A1 for the negative mask updates or the extraction of the non-predictable bit statuses (NP bits). The compressed packet therefore now consists of the run length encoded result of the XOR of the recently transitioned bits with the reference packet followed by other positive or negative updates to the mask plus the states of the non-predictable bits which have not recently transitioned.

On the decompression side, an extra buffer tracks the recently transitioned bits. In the uncompressed packet the run length encoded result for this buffer is used to write the inverse state compared to the reference data for those bits that are set and the same state for those that are not. The result is then used to update the ground mask (i.e., the bit mask at the decoder side) which is then used to allocate the rest of non-predictable bits their correct state in the uncompressed packet. All advantages of WO 2018/145730 A1 are maintained in terms of robustness.

The introduction of this concept improves the compression performance of WO 2018/145730 A1 (especially for packets that do not compress well). More importantly it makes the compression performance much more predictable for all packets, significantly reducing important parameters such as worst compression rate and standard deviation.

For some systems this maybe not be important because statistically the compression performance has been shown to be very constant over a number of scenarios (e.g., in safe mode) and time (e.g., years). The known technique however occasionally shows large deviations in performance. These instances are not important statistically but could be if one relies on the extra bandwidth to be available at all times. In this regard, methods according to embodiments of this disclosure make the bandwidth available much more predictable and smooth any occasional wild swings in compression performance that may be experienced when using the known technique.

As will be described below, there are additional steps, compared to the known technique, involved in the compression and decompression phases. These are not major (especially for compression), but may imply that the methods according to embodiments of the disclosure run somewhat slower than the known technique under certain limited circumstances. Also, there is the need to store the new class of bits that recently transitioned in an extra memory buffer. Further, in some implementations a saved mask needs to be stored. Buffers that are suitable for these purposes can be stored in word arrays. Assuming a 32 bit processor this means that extra buffers equating to between one quarter and one half of the allocation of the incoming packet are required.

FIG. 1 illustrates, in flowchart form, a method 100 of encoding fixed length data bit strings according to embodiments of the disclosure. Method 100 may be a method of encoding time series data, for example (e.g., housekeeping/telemetry data) of a remote system (monitored system).

At step S110, a sequence of data bit strings is received. These data bit strings may be data bit strings of telemetry data, for example. The data bit strings may be fixed length data bit strings, i.e., they may have equal length (include the same number of bits). The length of the data bit strings (in terms of a number of bits) also determines the lengths of a reference bit string, a mask bit string, a mask update bit string, and a tracking bit string as defined below. Accordingly, for each bit (bit position) in a given data bit string, there is a corresponding bit in each of the reference bit string, the mask bit string, the mask update bit string, and the tracking bit string. Corresponding bits in two bit strings are understood to be bits that are in the same bit position in respective bit strings.

At step S120, the data bit strings are sequentially encoded. Sequentially encoding the data bit strings may comprise periodically updating the mask bit string and the tracking bit string. The mask bit string and the tracking bit string may be synchronously (jointly) updated, i.e., during processing of the same data bit string in the sequence of data bit strings. Such update of the mask bit string and the tracking bit string may be referred to as a tracking update. A tracking update may be performed periodically, as noted above, but it may also be performed on request or on occurrence of an appropriate trigger. The time span (interval) between two tracking updates may be referred to as period/cycle.

The mask bit string is indicative of which bits in the data bit strings are predictable and which bits in the data bit string are not predictable. Predictable bits are those bits that are expected to be identical (same value "0" or "1") to their corresponding bits in the reference bit string for the respective data bit string and not predictable bits are those bits that are expected to be not identical to their corresponding bits in the reference bit string for the respective data bit string. For example, bits (bit positions) that are not predictable may be indicated by the mask bit string, e.g., by a set bit in the respective bit position of the mask bit string. The tracking bit string is indicative of which bits in the mask bit string have recently changed. For example, the tracking bit string may indicate bits (bit positions) for which there has been a change in the mask bit string during the last full period (e.g., at the end of the last full period). Bits indicated by the tracking bit string are understood to be those bits whose bit positions are indicated by the tracking bit string, e.g., bit positions for which the tracking bit string has a set bit.

Figure 2:
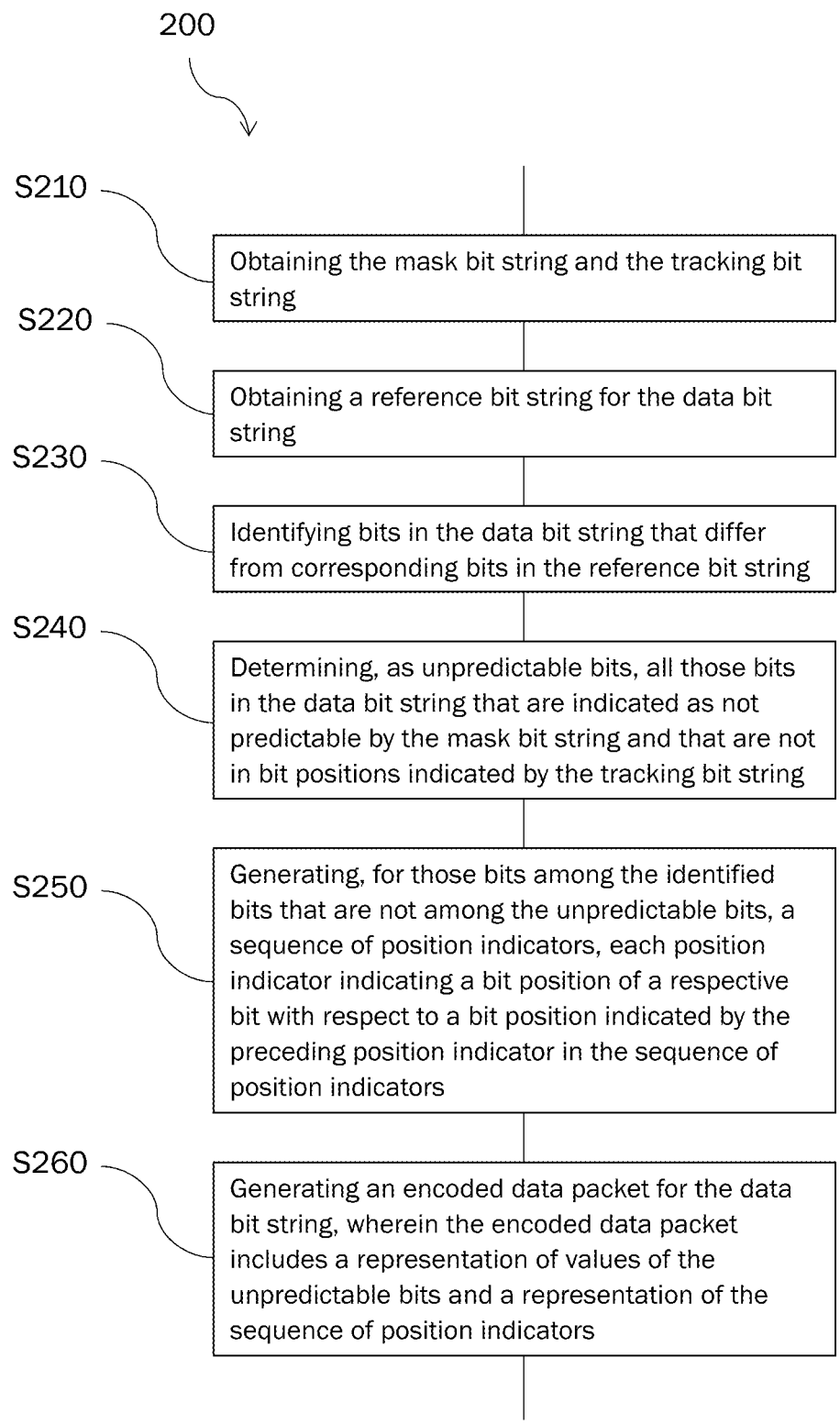
FIG. 2 illustrates, in flowchart form, an implementation example of the method of FIG. 1.

FIG. 2 illustrates, in flowchart form, a method 200 that can be included in step S120 of method 100, i.e., that can be part of sequentially encoding the data bit strings. Steps S210 to S260 are performed for a data bit string among the sequence of data bit strings that is to be encoded (e.g., for each data bit string among the sequence of data bit strings).

At step S210, the mask bit string and the tracking bit string are obtained (e.g., read). The mask bit string and the tracking bit string obtained at this step for a given data bit string may be respective bit strings as present at the end of processing/decoding the preceding data bit string.

At step S220, a reference bit string for the data bit string is obtained (e.g., read). The reference bit string for the data bit string at hand may be the immediately preceding data bit string in the sequence of data bit strings (i.e., the data bit string that has been last processed/encoded).

At step S230, bits in the data bit string that differ from corresponding bits in the reference bit string are identified. This may involve comparing the data bit string to the reference bit string. For example, the differing bits may be identified by performing an XOR-of the data bit string and the reference bit string.

At step S240, all those bits in the data bit string that are indicated as not predictable by the mask bit string and that are not in bit positions indicated by the tracking bit string are determined to be unpredictable bits (NP bits). This implies that the proposed method distinguishes between predictable bits, non-predictable bits, and bits that have recently toggled from predictable to non-predictable or vice versa. Only bits that had been indicated as not predictable for a certain time span are determined to be unpredictable bits. The values (e.g., "0" or "1") for the unpredictable bits may be included into the encoded data packet in the clear (e.g., in a NP bit field of the data packet).

At step S250, a sequence of position indicators is generated for those bits among the identified bits (bits identified at step S230) that are not among the unpredictable bits. Each position indicator indicates a bit position of a respective bit with respect to a bit position indicated by the preceding position indicator in the sequence of position indicators. A first position indicator in the sequence of position indicators may indicate the bit position with respect to an initial bit position, in a predetermined scan order, in the data bit string (e.g., with respect to the LSB position). Position indicators that indicate bit positions of respective bits that are indicated by the tracking bit string encode the bit position with reference to the tracking bit string. For instance, each of these position indicators can give an indication of a number of set bits in the tracking bit string between the bit position indicated by the present position indicator of this type and the bit position indicated by the preceding position indicator (regardless of the type of that position indicator).

Accordingly, the sequence of position indicators may include first-type position indicators and second-type position indicators (possibly in addition to other types of position indicators). The first-type position indictors may relate to the bits among the identified bits that are indicated by the tracking bit string. The second-type position indicators may relate to bits among the identified bits that are not indicated by the tracking bit string. As noted above, the first-type position indicators may indicate respective bit positions in terms of a number of set bits in the tracking bit string located between the bit position indicated by the preceding position indicator in the sequence of position indicators and the respective bit position. The number of set bits in the tracking bit string may include the set bit at the bit position indicated by the respective first-type position indicator. To this end, the position indicators may each include a respective counter (count value). For each first-type position indicator, the count value may indicate the number of set bits in the tracking bit string located between the bit position indicated by the preceding position indicator in the sequence of position indicators and the bit position indicated by the present first-type position indicator. For each second-type position indicator, the count value may indicate the number of bit positions located between the bit position indicated by the preceding position indicator in the sequence of position indicators and the bit position indicated by the present first-type position indicator. To be able to distinguish between different types of position indicators, each position indicator may include a label identifying the respective position indicator to be either a first-type position indicator or not a first-type position indicator. For example, a set bit (flag) in a predefined position of a position indicator may indicate that the position indicator is a first-type position indicator.

At step S260, an encoded data packet for the data bit string is generated. The encoded data packet includes a representation of values of the unpredictable bits (NP bits, e.g., in a first data field (NP bit field)) and a representation of the sequence of position indicators (counters, e.g., in a second data field (counter field)).

Figure 3:
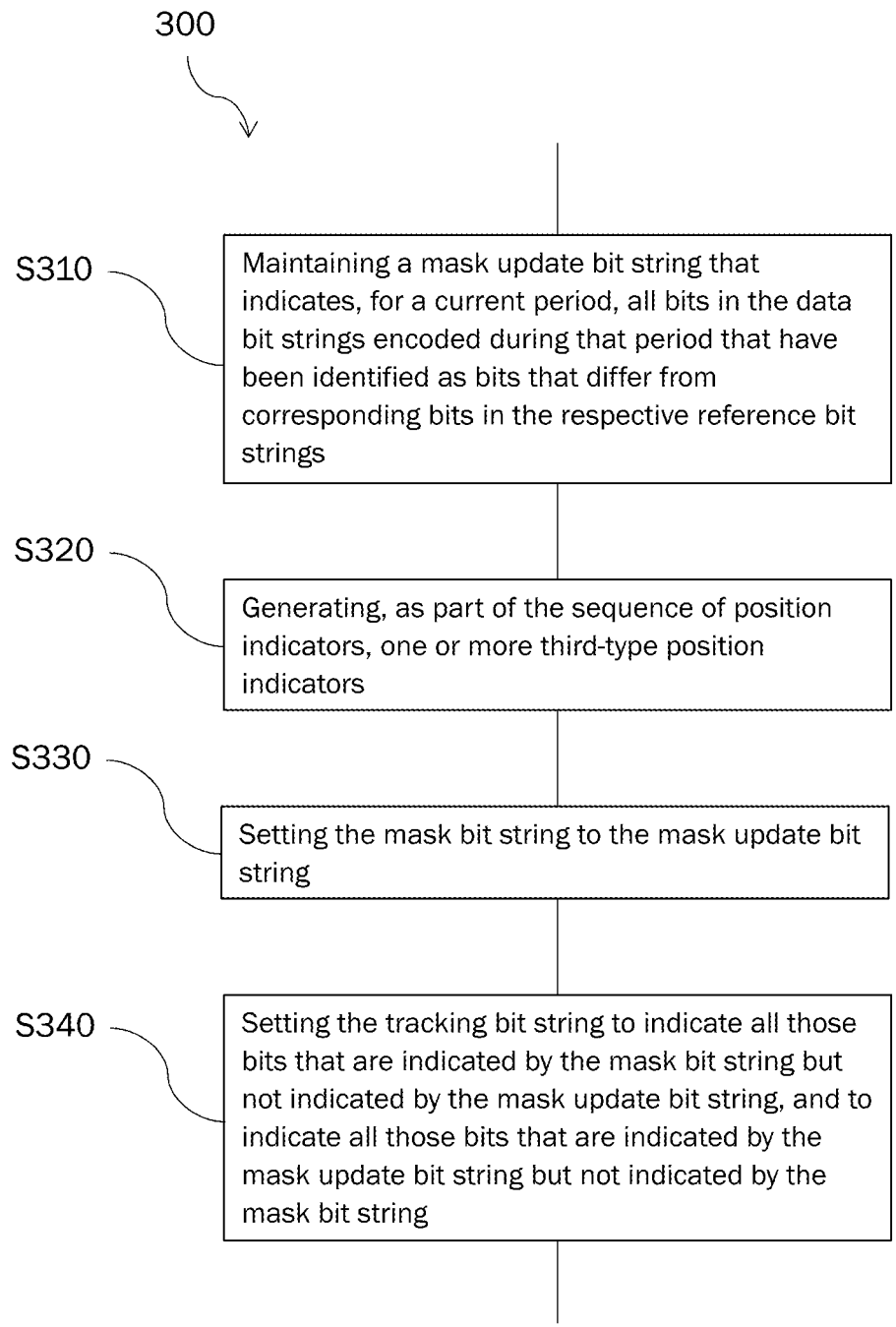
FIG. 3 illustrates, in flowchart form, examples of additional steps of the method of FIG. 1, FIG. 4 schematically illustrates a block diagram of an example framework for performing methods of encoding fixed length data bit strings according to embodiments of the disclosure, FIG. 5 schematically illustrates an example of a logic block in the block diagram of FIG. 4, FIG. 6 schematically illustrates examples of transitions between classifications for bits in a fixed length data bit string according to embodiments of the disclosure.

FIG. 3 illustrates, in flowchart form, a method 300 that can be further included in step S120 of method 100, i.e., that can be part of sequentially encoding the data bit strings. Steps S320 and S330 may be performed when performing a (periodic) update of the mask bit string. Step S340 may be performed when performing a (periodic) update of the tracking bit string. Notably, the mask bit string and the tracking bit string are preferably updated simultaneously, i.e., during/after processing of the same data bit string. As such, steps S320 to S340 may be performed during a tracking update.

As noted above, the time span between two periodic updates of the mask bit string and tracking bit string may be referred to as period (or tracking period) in the context of this disclosure. The mask bit string may also be updated on request, in addition to the periodic updates. On occurrence of such requested update, the tracking bit string is updated as well. Although not fully appropriate, the time span between two updates of the mask bit string may be referred to as period (tracking period) as well, for reasons of conciseness.

At step S310, a mask update bit string is maintained. The mask update bit string indicates, for a current period, all bits in the data bit strings encoded during that period that have been identified as bits that differ from corresponding bits in their respective reference bit strings. That is, the mask update bit string aggregates all those bits (bit positions) for which there has been a change from the reference bit string to the respective data bit string (e.g., a change from one data bit string to the next data bit string in the sequence) during the current period. Accordingly, for each data bit string, bit positions of any bits that differ from respective corresponding bits in the reference bit string for that data bit string may be set in the mask update bit string. This may be achieved by performing an OR of a previous mask update bit string with a bit string indicating any difference bits for the present data bit string. Needless to say, the length of the mask update bit string is the same as the length (in terms of a number of bits) of the data bit strings, the reference bit strings, the mask bits string, and the tracking bit string.

At step S320, one or more third-type position indicators are generated as part of the sequence of position indicators. Each third-type position indicator indicates a respective bit (bit position) within the data bit string that is indicated by the mask bit string and that is not indicated by any of the mask update bit string or the tracking bit string. The third-type position indictors can be distinguished from the second-type position indicators by noting that third-type position indicators are those position indicators that are not labelled as first-type position indicators and that indicate a bit position that is also indicated by the mask bit string (e.g., the mask bit string that is maintained at the decoder side). The third-type position indicators may notify the decoder side of any positive updates of the mask bit string that should be performed at the decoder side.

At step S330, the mask bit string is set to the mask update bit string. As noted above, this step is performed (only) when the mask bit string needs to be updated (e.g., at the end of a period).

At step S340, the tracking bit string is set to indicate all those bits that are indicated by the mask bit string but not indicated by the mask update bit string, and to indicate all those bits that are indicated by the mask update bit string but not indicated by the mask bit string. As noted above, this step is performed (only) when the tracking bit string needs to be updated (e.g., at the end of a period).

When all updates have been performed, the mask update bit string is reset (e.g., to all zeros).

In some embodiments, step S120 may further comprise, for the data bit string among the sequence of data bit strings, updating the tracking bit string to also indicate bit positions of the identified bits in the data bit string that differ from corresponding bits in the reference bit string and that are not indicated by the mask bit string. That is, the tracking bit string may aggregate, during a given period, all those bits (bit positions) for which there has been a change from one data bit string to the next data bit string in the sequence during that period and which were previously classified as predictable. This continuous update of the tracking bit string may anticipate some of the updates of the tracking bit string described above with reference to step S340. Next, pseudo-code illustrating the above processing during encoding will be provided. The processing requires a number of buffers that all have the same length (i.e., the length of the data bit strings to be compressed). These buffers are all initialized to zero before the first data bit string among the sequence of data bit strings to be compressed is received. These buffers are denoted as follows:

```
new:       incoming data bit string to be compressed
ref:       reference bit string for the incoming data bit string,
           i.e., immediately preceding data bit
           string
mask:      current mask bit string
update:    mask update bit string (built up over the current period
           (tracking period))
tracking:  tracking bit string (details bits that transitioned in
           and out of the mask bit string over the
           last tracking period)
```

The data bit strings may be processed in units of words (that correspond to a unit length processable by a processor that performs the compression). Alternatively, the data bit strings may be processed as a whole in one go, depending on implementations. In the latter case, the word length would have to be set to the length of the data bits strings in the pseudocode. In the following, it is assumed that the data bit strings are processed in one go, in the understanding that the skilled person would be able to readily implement a word-based processing of the data bit strings if needs be.

The compressed data packet to be output may comprise a first data field (e.g., NP field or NP bit field) for storing a representation of the unpredictable bits (NP bits) and a second data field (e.g., counter field) for storing a representation of the sequence of counters (position indicators). In the below example, without intended limitation, the compressed data packet further comprises either or both of a first indicator bit indicating whether or not a tracking update (update of mask bit string and tracking bit string) has occurred at the encoder side (and is thus necessary also on the decoder side) and a second indicator bit indicating whether or not a sequence of counters (position indicators) are included in the compressed packet (i.e., in the second data field, or counter field).

Initialization for compression of a data bit string may proceed as follows:
```
{
   Set old bit position = last bit of data bit string + 1   // sets the initial position to the end
                                                               (LSB) of the data bit string
   Set the NP field of compressed packet to all zeros
   Set first indicator bit of compressed packet to zero //
          required to indicate whether a tracking
          update has occurred or not
```

-continued
```
   Set second indicator bit of compressed packet to zero  //
          required to indicate that counters are
          produced. Will be reset to one if none
          are
   tracking_update_counter = 0;    // sets counter which
                                      issues a tracking update
                                      at a predetermined
                                      number of runs to zero
   tracking_count = 0;  // set tracking count that counts the number
                           of set bits in the tracking
                           bit string as the bit
                           string is traversed to zero
}
```

The above initialization is performed for each data bit string that needs to be compressed. After initialization, the data bit string to be compressed (e.g., the current data bit string in the sequence of data bit strings) is processed in a given processing direction. For example, without intended limitation, the data bit string may be processed working backwards, from the least-significant bit (LSB) to the most-significant bit (MSB). In alternative implementations, the processing direction may be from the MSB to the LSB. This processing proceeds as described by the pseudocode below, where ^ indicates an XOR operation, | indicates an OR operation, and ~ indicates the inverse (inv) of a bit string.

```
{
   xor = ref ^ new;          // xor is the XOR of the old data
                                bit string (ref) and new input data
                                bit string (new), cf. step S230
   update = update | xor     // adds new bits that have changed
                                to update (mask update bit string),
                                cf. step S310
   ref = new;   // ref (old) is updated with the new input data
                   bit string new, cf. step S220
   trigger = tracking | mask | xor;    // combine the three bit
                                          triggers into a new bit string
                                          trigger
   While trigger != 0 {      // iterate until no more set bits in
                                trigger exist
       x = trigger & ~trigger;         // mechanism to find a bit
                                          string x in which only the
                                          LSB that is set in trigger
                                          is set
       IF (x & tracking) {             // set bit in trigger is
                                          covered by tracking bit string
           tracking_count++ ;          // increment the tracking
                                          counter that counts the
                                          number of set bits in the
                                          tracking bit string as the bit
                                          string is traversed
       IF (x & xor) {                  // set bit in trigger is
                                          covered by the tracking bit
                                          string and it has changed from
                                          its previous state
           Calculate old bit position;         // calculate the
                                                  absolute bit
                                                  position (bit
                                                  position in data
                                                  bit string string)
                                                  and set the old bit
                                                  position to this
                                                  bit position
           write tracking_count to counter field;   // write
                                                       tracking count to
                                                       output packet (e.g.,
                                                       first-type counter
                                                       flag + counter for
                                                       small distances),
                                                       cf. step S250,
                                                       first-type position
                                                       indicator
```

```
            tracking_count = 0;          // reset tracking
                                            counter to zero
        }
    } ELSE {   // set bit in trigger is not covered by tracking
                                            bit string
        IF (x & mask) {    // the set bit in trigger is masked,
                                            i.e., covered by the mask bit
                                            string
            IF (tracking update) & (x & inv(update)) {
                                            // set bit in
                                            trigger is covered
                                            by the mask bit
                                            string, it has not
                                            changed from one
                                            data bit string to
                                            the next during the
                                            last period, and a
                                            tracking update is
                                            necessary. Hence, a
                                            positive update of
                                            the mask bit string
                                            should be performed
                Calculate new bit position;   // calculate the
                                            absolute bit position
                                            (bit position in data
                                            bit string string)
                                            and set the new bit
                                            position to this bit
                                            position
                delta = old bit position − new bit position;
                                            // calculate delta
                                            (delta count) for use
                                            as a counter (count
                                            value)
                old bit position = new bit position;   // update
                                            old bit position
                write delta count to counter field;    // write
                                            delta count to output
                                            packet as (third-
                                            type) position
                                            indicator (e.g. ,
                                            delta flag bit +
                                            counter for larger
                                            distances), cf. step
                                            S320
                tracking_count = 0;       // reset tracking
                                            counter to zero
            } ELSE   { // set bit in trigger is covered by the mask
                                            bit string but not
                                            by the tracking bit
                                            string - it is
                                            treated as an
                                            unpredictable (NP)
                                            bit, cf. step S240
                IF (x & ref) {             // if the bit value
                                            of the incoming
                                            packet new at that
                                            position is '1'
                    set next bit in NP field;  // write a '1'
                                            to the NP field in the
                                            output packet
                } ELSE   { // else the bit value of the incoming
                                            packet new at that
                                            position is '0'
                    mover NP write pointer;   // just move the NP
                                            write pointer in the
                                            output packet (this
                                            is the same as
                                            setting the
                                            corresponding bit in
                                            the NP field to zero)
                }
            } ELSE { // the bit is not covered by the mask bit
                                            string and is not
                                            covered by the
                                            tracking bit string,
                                            hence it must be
                                            covered by xor
                Calculate new bit position;   // calculate the
                                            absolute bit position
                                            (bit position in data
                                            bit string string)
                                            and set the new bit
                                            position to this bit
                                            position
                delta = old bit position − new bit position; //
                                            calculate delta
                                            (delta count) for use
                                            as a counter (count
                                            value)
                old bit position = new bit position;   // update
                                            old bit position
                create delta count;         // write delta count
                                            to output packet as
                                            (second-type)
                                            position indicator
                                            (e.g., delta flag bit
                                            + counter for larger
                                            distances), cf. step
                                            S250, second-type
                                            position indicator
                tracking_count = 0;        // reset tracking
                                            counter to zero
                tracking = tracking | x;    // sets the present
                                            bit in the tracking
                                            bit string
            }
        }
        trigger = trigger − x;             // mechanism to remove LSB
                                            in trigger
    } // end of individual bit string processing
    IF (tracking update) {                 // if a tracking update is
                                            required (i.e., when
                                            tracking_update_counter has
                                            reached a predefined value),
                                            reset the mask bit string,
                                            tracking bit string, and mask
                                            update bit string
        tracking = ((~mask & update & tracking) | (~update &
                                            mask]));
                                            // calculates new tracking bit
                                            string (negative updates ORed
                                            with positive updates), cf.
                                            step S340
        mask = update;     // updates the mask bit string to be the
                                            same as the mask update bit
                                            string, cf. step S330
        update =0;    // resets the mask update bit string to zero
                                            (i.e., to all zeros)
    }
                                            // end of bit string processing
    if (absolute counters required) {
        process and append absolute counters
                                            // write information to output
                                            packet that allows to
                                            reconstruct the mask bit string
                                            and the tracking bit string
                                            without prior information
    }
    If (no counters) {      // counter size is zero bits, i.e.,
                                            no counters (position indicators)
                                            have been written to the output
                                            packet
        sets second bit of compressed packet to one   // sets a
                                            flag to indicate there is no
                                            counter filed
    } ELSE {
        Add zero counter      // such counter (position
                                            indicator) indicates that
                                            counters have ended; any
                                            other indication that there
                                            are no further counters
                                            (position indicators) is
                                            feasible as well
    }
    IF (tracking update) {     // if a tracking update has been
                                            performed, communicate this to the
                                            decoder side and reset counter
```

```
            Resets first indicator bit of compressed packet to '1'
                                           // sets a flag (or any other
                                           suitable indicator) to indicate
                                           there has been a tracking
                                           update at the encoder side
            tracking_update_counter = 0;   // reset tracking update
                                           counter
        } ELSE {
            tracking_update_counter++;     // increment tracking update
                                           counter
        }
        output compressed         // the compressed packet may include
        packet                    the NP field and the counter field
                                  including counters (optionally
                                  followed by an indication that there
                                  are no more counters), optionally
                                  with first and second indicator bits
                                  and optional bit stuffing
    }
```

Figure 4:
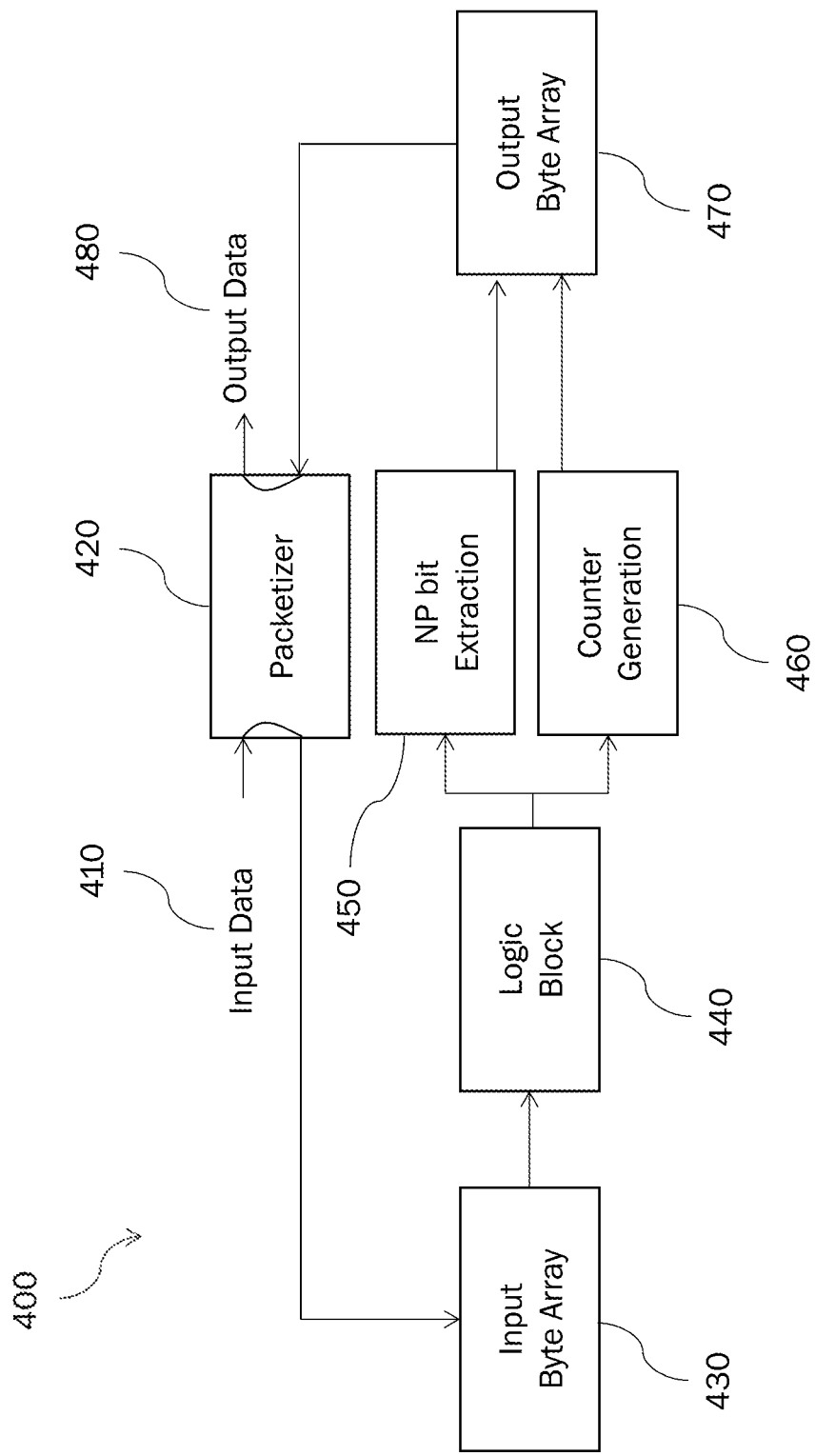

FIG. 4 schematically illustrates a block diagram of a framework 400 for performing methods of encoding fixed length data bit strings according to embodiments of the disclosure, such as methods 100, 200, and/or 300.

Input data 410 (e.g., time series data, such as housekeeping/telemetry data) is input to a packetizer 420, which provides a data bit string (bit array) 430. The data bit string 430 is processed by a logic block 440. The logic block 440 may perform the methods described above and provide a representation of the unpredictable bits (NP bits) 450 and a representation of counters (position indicators) 460. In some implementations, the representation of the NP bits 450 and the representation of the counters 460 are written to an output bit string (byte array) 470, which is packetized by the packetizer 420 to form output data 480, such as encoded data packets. In any case, the representation of the NP bits 450 and the representation of the counters 460 are included in an output packet for the input data 410.

Figure 5:
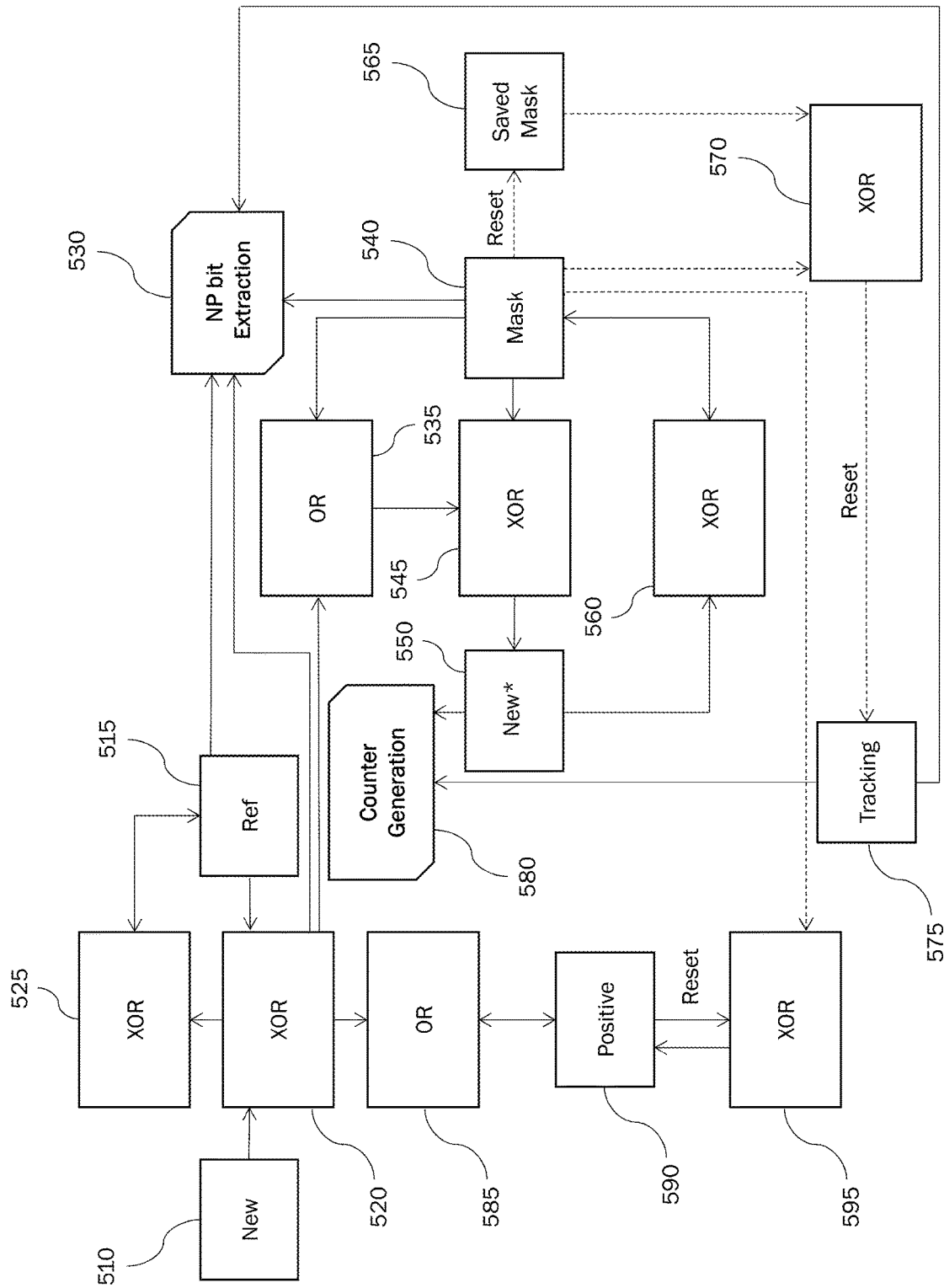

FIG. 5 schematically illustrates in implementation 500 of the logic block 440 in the block diagram of FIG. 4. Solid arrows indicate processing that is performed for each data bit string, while dashed arrows indicate processing that is performed on occurrence of a tracking update only.

An input data bit string ("New") 510 is input to a first XOR block 520 at which it is XORed with a reference bit string ("Ref") 515. The output of the first XOR block 520 (i.e., an indication of the difference bits between the input data bit string and the reference bit string, or difference bits for short) is provided to a second XOR block 525, a first OR block 535, a second OR block 585, and a NP bit extraction block 530.

The NP bit extraction block 530 also receives the reference bit string 515, the mask bit string ("Mask") 540, and the tracking bit string ("Tracking") 575. The NP bit extraction block 530 extracts/generates the unpredictable bits (NP bits) 450 in the manner described above (e.g., with reference to step S240).

The second XOR block 525 performs an XOR of the reference bit string and the output of the first XOR block 520 (i.e., the difference bits) and writes a result thereof to the reference bit string (after the reference bit string has been provided to the NP bit extraction block 530). This corresponds to updating (i.e., overwriting) the reference bit string 515 with the input data bit string 510.

The first OR block 535 performs an OR of the output of the first XOR block 520 (i.e., the difference bits) and the mask bit string 540. The result thereof (i.e., the mask bit string 540 with the bits in bit positions of the difference bits being additionally set) compared to the mask bit string 540 in a third XOR block 545. For example, said result may be XORed with the mask bit string 540 in the third XOR block 545. The output of the third XOR block 545, i.e., the unmasked difference bits ("New*") is provided to a counter generation block 580 together with the tracking bit string 575. The counter generation block 580 generates the counters (position indicators) 460 for the output bit string 470 (i.e., for the encoded output data packet) in the manner described above (e.g., with reference to step S250 and/or step S320).

In the second OR block 585, the output of the first XOR block 520 is ORed with the mask update bit string ("Positive") 590, and a result thereof is used to update (i.e., overwrite) the mask update bit string 590. Thereby, the mask update bit string 590 accumulates any bits that have changed from one input data bit string to the next.

The logic block of FIG. 5 further describes the following alternative implementations of updates of the mask bit string and the tracking bit string, which may differ from the ones described above with reference to the flowcharts.

In some implementations, the unmasked difference bits 550 are optionally XORed with the mask bit string 540 in a fourth XOR block 560, and an output thereof is used to update (i.e., overwrite) the mask bit string 540.

In some implementations, on occurrence of a tracking update the mask bits string 540 is XORed with a reference mask bit string ("Saved mask") 565 in a fifth XOR block 570, and the result thereof is used as the new tracking bit string 575 (i.e., is used to update/overwrite the tracking bit string 575). Subsequently, the reference mask bit string 565 is updated/overwritten with the mask bit string 540. Further on occurrence of a tracking update, the mask bit string 540 is updated/overwritten by the mask update bit string 590, which is subsequently reset (e.g., to all zeros). Updating the mask bit string 540 may involve a sixth XOR block 595.

Needless to say, respective blocks that implement logic bit operations (such as OR, XOR, for example) may be implemented by a single block for each operation, e.g., a single XOR block that is subsequently provided with appropriate inputs.

Figure 6:
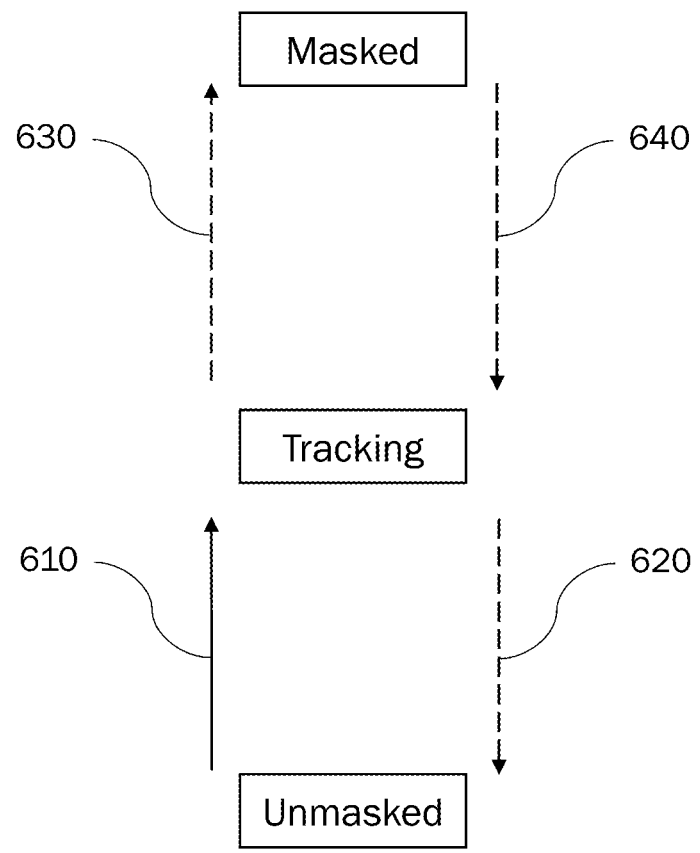

FIG. 6 schematically illustrates transitions between different classifications/statuses for classifying bits in a fixed length data bit string according to embodiments of the disclosure. Namely, the bits in the data bit string can be unmasked (i.e., not covered by the mask bit string) and not covered by the tracking bit string (status "unmasked"), they can be unmasked but covered by the tracking bit string (status "tracking"), and they can be masked (i.e., covered by the mask bit string, status "masked")). A bit that is masked is indicated as not predictable.

Given these statuses, a bit transitions from status "unmasked" to status "tracking" when it is not covered by the mask bit string but is found to differ from the corresponding bit (same bit position) in the reference bit string (solid arrow 610). This transition may occur at any time during a period/cycle (tracking period/cycle).

The remaining transitions (dashed arrows 620, 630, 640) may occur only on occurrence of a tracking update, i.e., at the start of a period/cycle. Accordingly, a bit transitions from status "tracking" to status "unmasked" if it was covered by the tracking bit string at the start of a period and it did not change (i.e., differ from the respective corresponding bit in the respective reference bit string) during that period (arrow 620). A bit transitions from status "tracking" to status "masked" if it was covered by the tracking bit string at the start of a period and it did change during that period (arrow 630). Finally, a bit transitions from status "masked" to status "tracking" if it was covered by the mask bit string at the start of a period and it did not change during that period (arrow 640).

Next, decoding/decompression of encoded data packets will be described with reference to FIG. 7 to FIG. 11. At the decoder side (e.g., on ground), the same bit strings may be maintained as at the encoder side. These bit strings are either constantly updated (for each data packet) or are updated at the end of each period/cycle (e.g., in accordance with an indicator bit in a respective data packet to do so) to retrace corresponding changes in these bit strings at the encoder side. As can be seen from the below explanations, the information included in the data packets is sufficient for doing so.

To summarize, decompression of a current data packet proceeds as follows when no tracking update is necessary for this data packet (e.g., when no tracking update has been performed for this data packet at the encoder side). First, the last decoded data bit string is copied into a buffer. For the bits in this buffer, bits indicated by the position indicators in the current data packet are inverted (i.e., flipped from '1' to '0' and vice versa). Then, the unpredictable bits in the current data packet are sequentially slotted into positions that are indicated by the mask bit string at the decoder side but not indicated by the tracking bit string at the decoder side. Following this step, the mask bit string at the decoder side is updated to also indicate bits indicated by the position indicators in the current data packet, and the tracking bit string at the decoder side is updated to also indicate bits indicated by the second-type position indicators in the current data packet. The resulting content of the buffer represents the decoded data bit string for the current data packet.

On the other hand, if a tracking update has been performed for the current data packet at the encoder side, decompression thereof proceeds as follows.

Those bits that are indicated by a position indicator and that are at the same time indicated by the mask bit string (the position indicator in this case is a third-type position indicator) are set to the same value as corresponding bits in the last decoded data bit string. The other position indicators (i.e., position indicators that do not refer to bits covered by the mask bit string) are processed in the same manner as when no tracking update has been performed for this data packet at the encoder side, see above. The mask bit string on the decoder side is then updated by removing those bits from the mask bit string (e.g., by setting them to '0') that are indicated by a position indicator and that are at the same time indicated by the mask bit string (positive update of mask bit string). Further, those bits that are covered by the tracking bit string and that did not change during the last period (i.e., no difference between data bit string and reference bit string for that bit during the period) are also removed from the mask bit string. Subsequently, the new tracking bit string is generated to indicate those bits that differ between the mask bit string and a saved version of the mask bit string (saved at the time of the last tracking update). For example, the new tracking bit string may be generated by XORing the mask bit string with the saved version of the mask bit string. Finally, the updated mask bit string is saved as the saved version of the mask bit string for the next tracking update.

Figure 7:
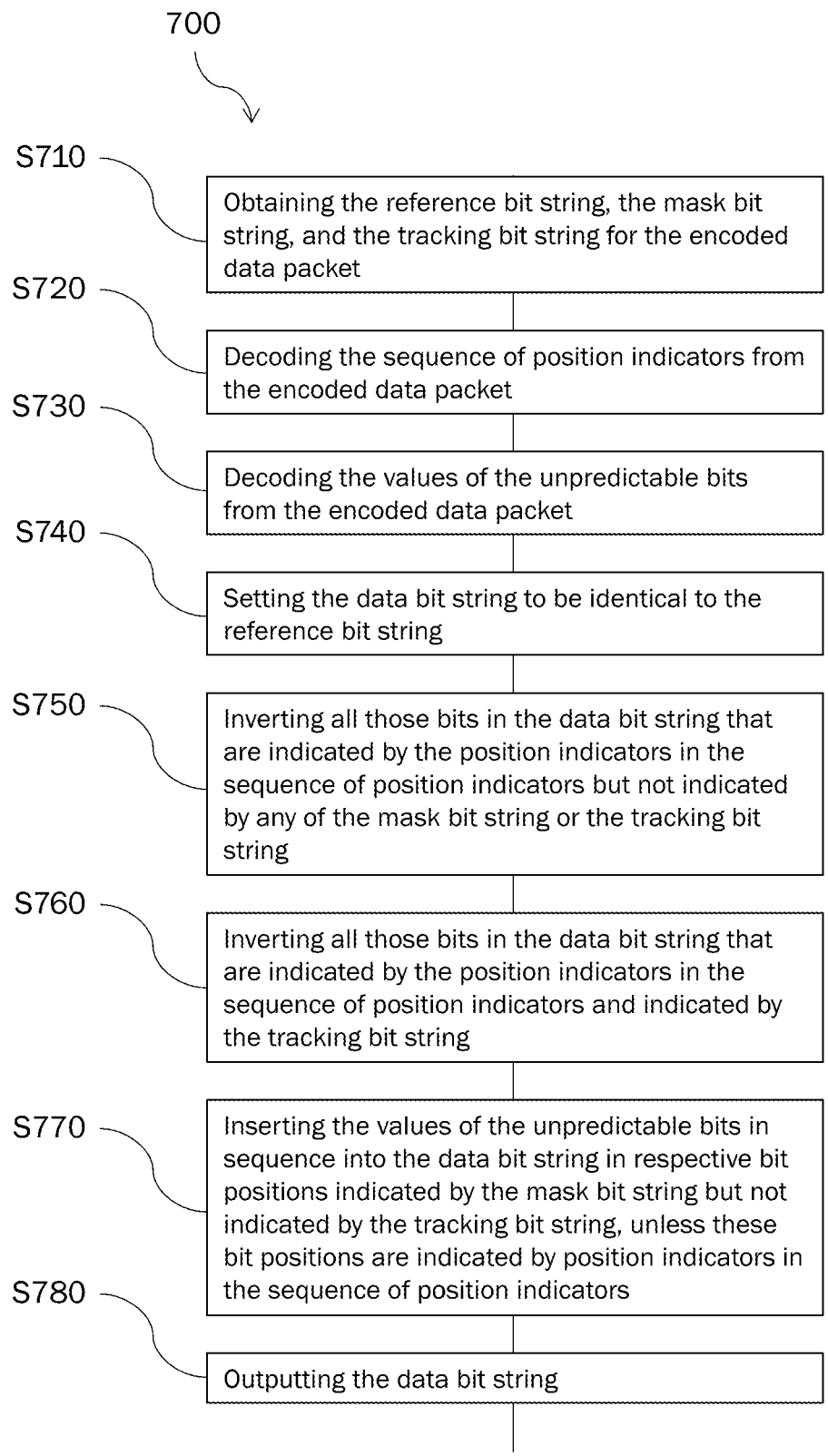
FIG. 7 illustrates, in flowchart form, an example of a method of decoding a plurality of encoded data packets into corresponding fixed length data bit strings according to embodiments of the disclosure.

FIG. 7 illustrates, in flowchart form, a method 700 of decoding/decompressing encoded data packets according to embodiments of the disclosure. Method 700 may be a method of decoding time series data by sequentially decoding a plurality of encoded data packets of time series data into corresponding decoded data bit strings of time series data, for example (e.g., housekeeping/telemetry data). Here, sequentially decoding the encoded data packets comprises periodically updating a mask bit string and periodically updating a tracking bit string. The mask bit string may also be continuously updated in some implementations. The mask bit string is indicative of which bits in the data bit strings are predictable and which bits in the data bit string are not predictable (e.g., bits indicated by the mask bit string (set bits in the mask bit string) may be not predictable). The tracking bit string is indicative of which bits in the mask bit string have recently changed. It is assumed that each encoded data packet includes a representation of values of unpredictable bits (NP bits) in the respective data bit string and a representation of a sequence of position indicators. The unpredictable bits are all those bits in the respective data bit string that are indicated as not predictable by the mask bit string and that are not in bit positions indicated by the tracking bit string. The position indicators indicate bit positions of difference bits in the respective data bit string that differ from corresponding bits in a reference bit string for the respective data bit string. Each position indicator indicates a bit position of a respective difference bit with respect to a bit position indicated by the preceding position indicator in the sequence of position indicators. Position indicators that indicate bit positions of respective difference bits that are indicated by the tracking bit string encode the bit position with reference to the tracking bit string.

Sequentially decoding the encoded data packets further comprises steps S710 to S780 for an encoded data packet (e.g., for each encoded data packet).

At step S710, the reference bit string, the mask bit string, and the tracking bit string for the encoded data packet are obtained (e.g., read). The reference bit string for the given data bit string may be the last data bit string that has been processed/decoded prior to decoding the given data bit string. The mask bit string and the tracking bit string obtained at this step for a given data bit string may be respective bit strings as present at the end of processing/decoding the preceding data bit string.

At step S720, the sequence of position indicators is obtained (e.g., extracted, decoded) from the encoded data packet. For example, the sequence of position indicators may be extracted from the second data field (counter field) of the data packet.

At step S730, the values of the unpredictable bits are obtained (e.g., extracted, decoded) from the encoded data packet. For example, the values of the unpredictable bits may be extracted from the first data field (NP field) of the data packet.

At step S740, the data bit string is set to be identical to the reference bit string. The actual reconstructed data bit string will be obtained by modifying certain bits in this initial version of the data bit string.

At step S750, all those bits in the data bit string that are indicated by the position indicators in the sequence of position indicators but not indicated by any of the mask bit string or the tracking bit string are inverted (i.e., they are flipped from "1" to "0" and vice versa).

At step S760, all those bits in the data bit string that are indicated by the position indicators in the sequence of position indicators and indicated by the tracking bit string are inverted (i.e., they are flipped from "1" to "0" and vice versa).

In consequence, bits in the data bit sting are inverted if they are indicated by first-type position indicators or second-type position indicators, but not if they are indicated by third-type position indicators.

At step S770, the values of the unpredictable bits (NP bits) are inserted in sequence into the data bit string in respective bit positions indicated by the mask bit string but not indicated by the tracking bit string, unless these bit positions are indicated by position indicators in the sequence of position indicators. Therein, bits in respective bit positions of the data bit string are replaced by the values of respective unpredictable bits. This implies that the same scan direction (processing direction) for traversing bit string is used as at the encoder side.

At step S780, the (decoded/reconstructed) data bit string is output. Needless to say, the output reconstructed data bit string is identical to the data bit string at the encoder side that has led to the generation of the encoded data packet at hand.

Although not shown in FIG. 7, the method 700 can further include continuously updating the tracking bit string to also indicate bit positions of the difference bits in the data bit string that differ from corresponding bits in the reference bit string. That is, the tracking bit string may be said to aggregate, during a given period/cycle, all those bits (bit positions) for which there has been a change from one data bit string to the next data bit string in the sequence of data bit strings during that period. In terms of position indicators, this amounts to (continuously) updating the tracking bit string to further indicate all those bits whose bit positions are indicated by those position indicators that do not encode the bit position with reference to the tracking bit string (second-type position indicators). As noted above, these position indicators may just indicate a total number of bits between their respective bit position and the bit position indicated by the preceding position indicator.

As has been described above in the context of the corresponding encoding method, the sequence of position indicators includes first-type position indicators and second-type position indicators (possibly in addition to other types of position indicators, such as third-type position indicators). Each position indicator may include a label identifying the respective position indicator to be either a first-type position indicator or not a first-type position indicator. The first-type position indicators relate to the bits among the difference bits that are indicated by the tracking bit string. The second-type position indicators relate to bits among the difference bits that are not indicated by the tracking bit string. The first-type position indicators indicate respective bit positions in terms of a number of set bits in the tracking bit string located between the bit position indicated by the preceding position indicator in the sequence of position indicators and the respective bit position. The number of set bits in the tracking bit string may include the set bit at the bit position indicated by the respective first-type position indicator.

If the mask bit string is continuously updated at the decoder side, the method may further comprise (not shown in FIG. 7) updating the mask bit string to further indicate as not predictable all those bits whose bit positions are indicated by the first-type and second type position indicators.

Figure 8:
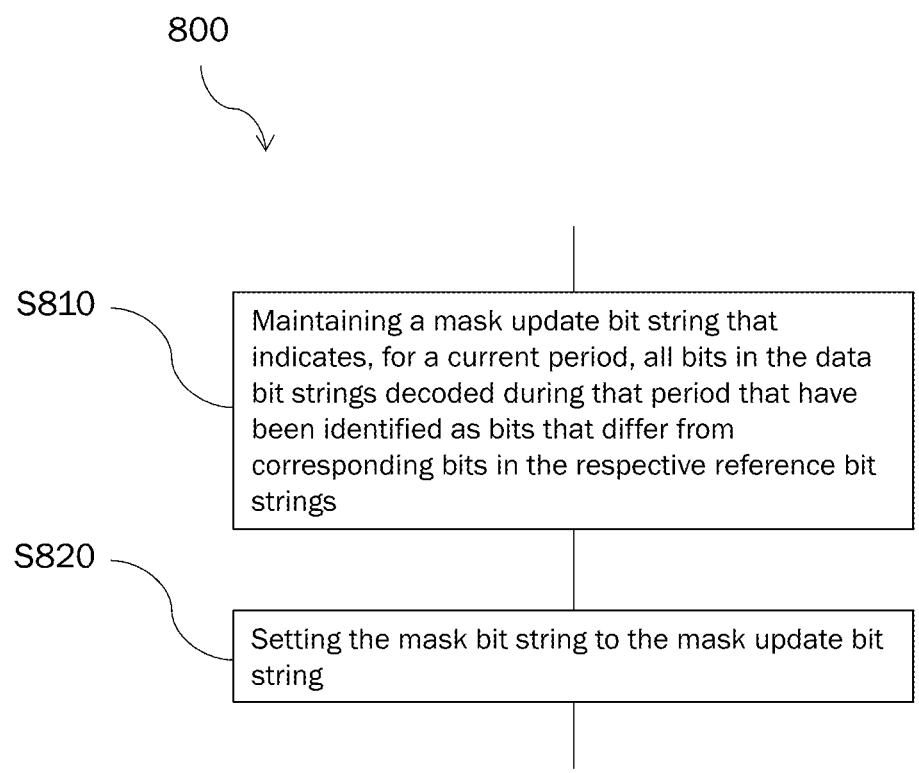
FIG. 8 illustrates, in flowchart form, examples of additional steps of the method of FIG. 7.

Alternatively, the mask bit string could be updated at the end of each period/cycle by method 800, which is illustrated, in flowchart form, in FIG. 8.

At step S810, a mask update bit string is maintained (e.g., updated throughout the sequential processing of data packets). Step S810 may be performed during the processing of each data packet, i.e., the mask update bit string may be updated with any difference bits for each data bit string that is decoded. The mask update bit string indicates, for a current period, all bits in the data bit strings decoded during that period that have been identified as bits that differ from corresponding bits in the respective reference bit strings. Accordingly, the mask update bit string may be said to aggregate all those bits (bit positions) for which there has been a change from the reference bit string to the respective data bit string (e.g., a change from one data bit string to the next data bit string in the sequence).

Step S820 is performed when an update (tracking update, e.g., periodic update) of the mask bit string is required (in general, if a respective indicator bit in the current data packet indicates that such update has been performed for that data packet at the encoder side). At this step, the mask bit string is set to the mask update bit string. At the same time, the mask update bit string may be reset (e.g., to all zeros).

Figure 9:
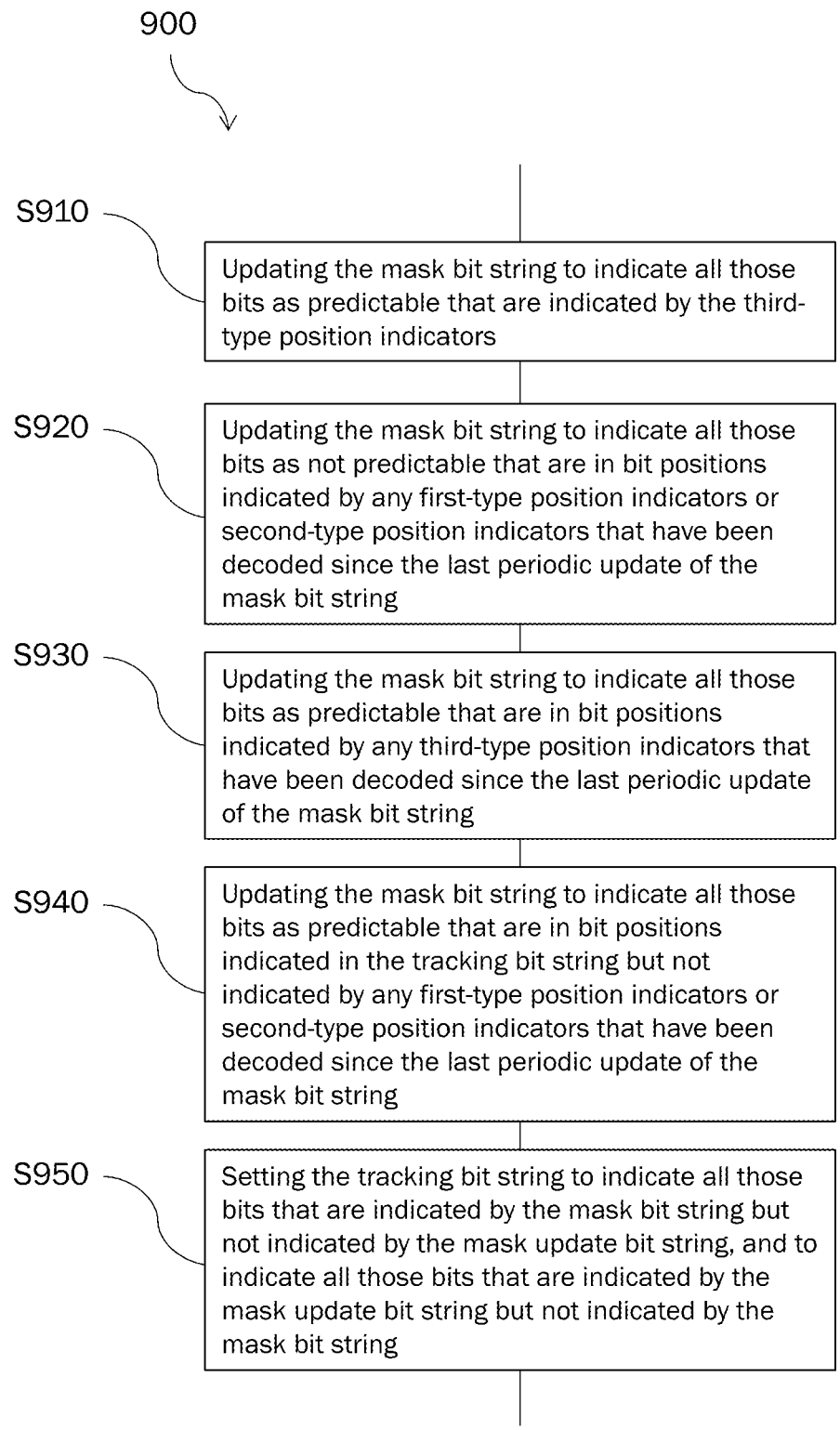
FIG. 9 illustrates, in flowchart form, further examples of additional steps of the method of FIG. 7.

Method 900, which is illustrated in flowchart form in FIG. 9, shows further steps that can be performed upon a tracking update. It is assumed that the sequence of position indicators further comprises one or more third-type position indicators. Each third-type position indicator indicates a respective bit position that is also indicated by the mask bit string but is not indicated by the tracking bit string. At the decoder side, the third-type position indictors can be distinguished from the second-type position indicators by noting that third-type position indicators are those position indicators that are not labelled as first-type position indicators and that indicate a bit position that is also indicated by the (possibly constantly updated) mask bit string at the decoder side.

At step S910, the mask bit string is updated to indicate all those bits as predictable that are indicated by the third-type position indicators (positive update). This may involve removing these bits from the mask bit string (e.g., by unsetting them, i.e., setting them to zero).

At step S920, the mask bit string is updated to indicate all those bits as not predictable (negative update) that are in bit positions indicated by any first-type position indicators or second-type position indicators that have been decoded since the last tracking update (e.g., periodic update) of the mask bit string.

At step S930, the mask bit string is updated to indicate all those bits as predictable that are in bit positions indicated by any third-type position indicators that have been decoded since the last periodic update of the mask bit string (if any).

At step S940, the mask bit string is updated to indicate all those bits as predictable (positive update) that are in bit positions indicated in the tracking bit string but not indicated by any first-type position indicators or second-type position indicators that have been decoded since the last periodic update of the mask bit string.

At step S950, the tracking bit string is set to indicate all those bits that are indicated by the mask bit string but not indicated by the mask update bit string, and to indicate all those bits that are indicated by the mask update bit string but not indicated by the mask bit string.

Figure 10:
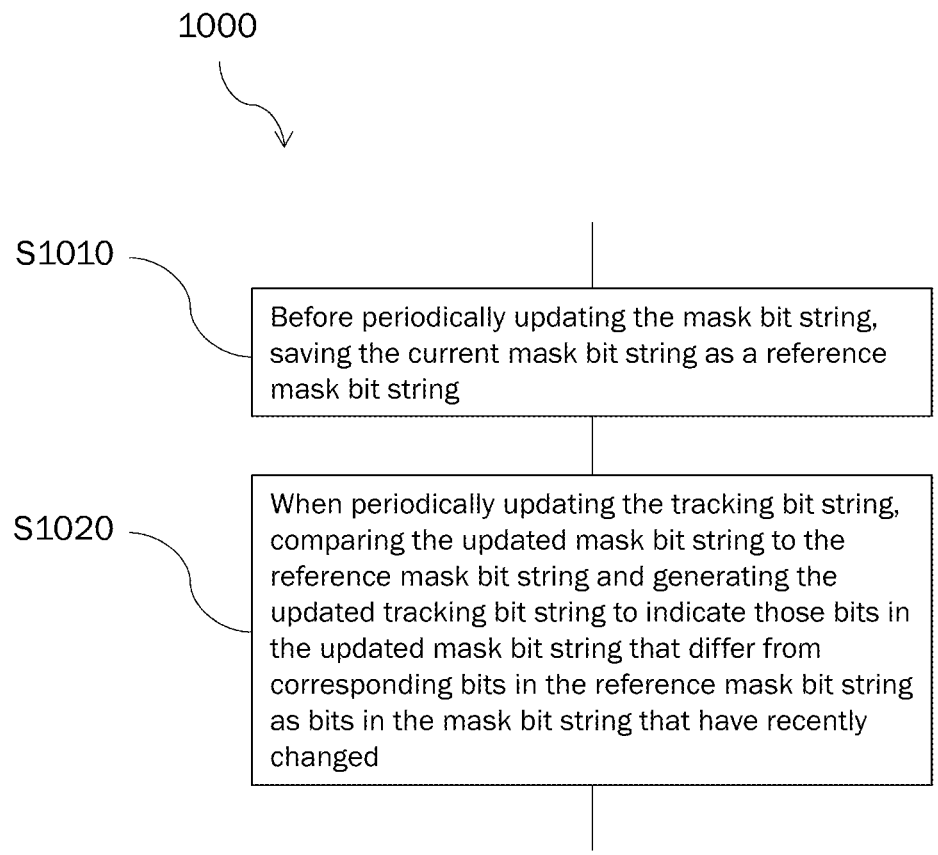
FIG. 10 illustrates, in flowchart form, yet further examples of additional steps of the method of FIG. 7, and FIG. 11 schematically illustrates an example of a method of traversing a fixed length data bit string in accordance with a set of position indicators according to embodiments of the disclosure.

As an alternative to step S950, the tracking bit string may be updated, upon occurrence of a tracking update, by method 1000 as illustrated, in flowchart form, in FIG. 10.

At step S1010, before updating the mask bit string at the occurrence of a tracking update (e.g., periodic update), the current mask bit string is saved as a reference mask bit string (saved version of the mask bit string).

At step S1020, when updating the tracking bit string at the occurrence of a tracking update (e.g., periodic update), the updated mask bit string is compared to the reference mask bit string. This may involve performing an XOR of the updated mask bit string and the reference mask bit string. The updated tracking bit string is generated to indicate those bits in the updated mask bit string that differ from corresponding bits in the reference mask bit string as bits in the mask bit string that have recently changed. For instance, the updated tracking bit string may be the XOR of the updated mask bit string and the reference mask bit string.

Figure 11:
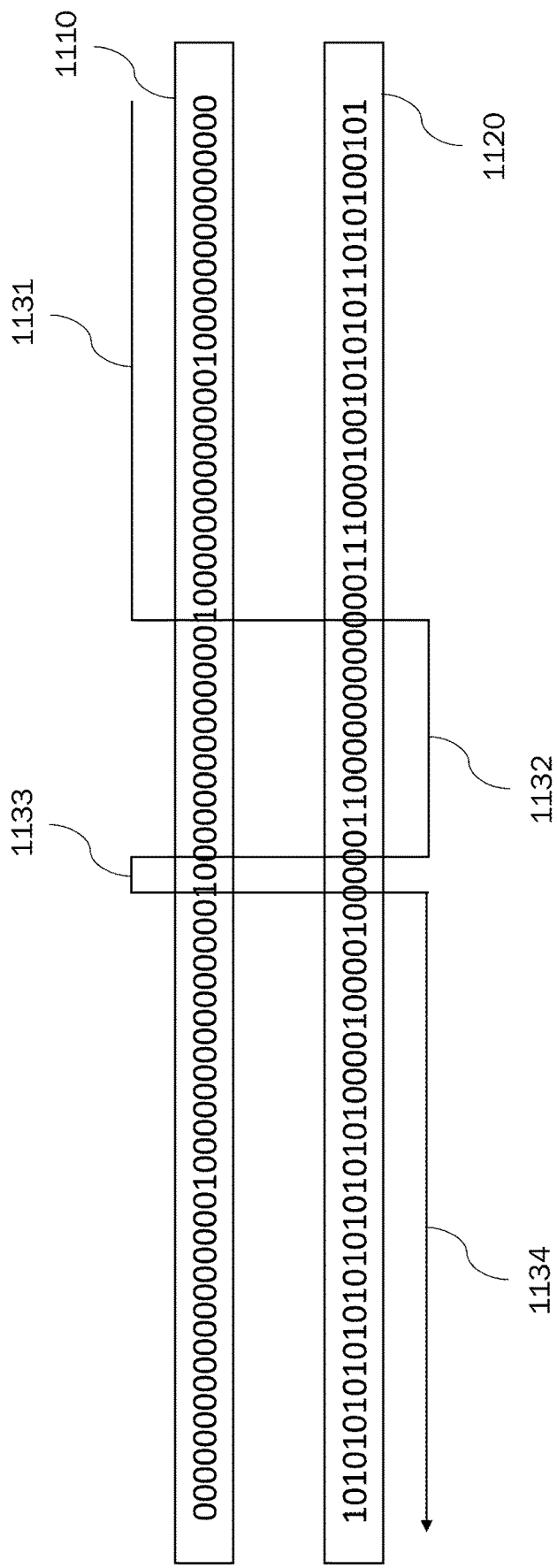

FIG. 11 schematically illustrates an example of method of traversing bit positions in a fixed length data bit string in accordance with a set of position indicators according to embodiments of the disclosure. The upper bit string 1110 indicates the tracking bit string, whereas the lower bit string 1120 indicates the reference bit string (or the data bit string that has been initialized to the reference bit string, e.g., at step S740). The example of FIG. 11 assumes a sequence of a first-type position indicator with a count value of "2", a second-type position indicator with a count value of "13", and again a first type position indicator with a count value of "1". This sequence may be followed by an indication that the preceding position indicator is the last position indicator in the sequence, such as a first-type position indicator with a count value of "0", for example.

The first-type position indicator with a count value of "2" means that the encoded bit position is at the bit position of the second set bit in the tracking bit string 1110, starting from the bit position encoded by the preceding position indicator (which would be the starting bit, e.g., LSB, in this case, since the first-type position indicator is the first position indicator in the sequence of position indicators). Thus, this first-type position indicator corresponds to bit distance 1131. The next position indicator in the sequence, i.e., the second-type position indicator with count value "13" means that the encoded bit position is 13 bits removed (in the scan direction) from the bit position encoded by the preceding position indicator. Thus, this second-type position indicator corresponds to bit distance 1132. The next position indicator in the sequence, i.e., the first-type position indicator with count value "1" means that the encoded bit position is at the bit position of the first set bit in the tracking bit string 1110, starting from the bit position encoded by the preceding position indicator. Thus, this first-type position indicator corresponds to bit distance 1133.

As can be seen from this example, first-type position indicators can indicate large distances in terms of bits with very small numbers. For instance, the first-type position indicator with (small) count value "2" relates to (large) bit distance of 28. Next, the rationale that underlies the proposed technique for encoding and decoding fixed length data structures according to embodiments of the disclosure will be described.

The tracking bit string captures the recent transitions between predictable and not predictable bits (i.e., corresponding changes in the mask bit string). These bits are most likely to transition back to their original state in the short term. For instance, a bit that has not changed from one data bit string to the next for an extended period of time, but then has changed once is likely to change back and then again not change for an extended period of time. On the other hand, a bit that has frequently changed from one data bit string to the next has not changed from a given data bit string to the next is likely to continue toggling between states in the future. It is important to note that typically (especially for time series data, e.g., housekeeping/telemetry data) there are not many of these "transition bits" compared to whole input data bit string at any one time. This means that the tracking bit string is sparse. So grouping these bits means they can be compressed effectively even if they have a higher probability of being set than the others.

This is achieved by using a different counter (first-type position indicator) for coding the bit positions of the "transition bits". Since their positions are coded with reference to the tracking bit string, i.e., in term of a number of set bits in the tracking bit string between respective positions, they can be coded by significantly smaller numbers than the counters for the remaining bits (second-type position indicators). Since the counters are all generated in one pass over the data bit string, distances between respectively indicated bit positions are comparatively short, which further improves compression efficiency.

Finally, positive updates of the tracking bit string at the decoder side do not have to be signaled explicitly, since they are implicit in the first-type position indicators, which further improves compression efficiency.

Advantages of the proposed techniques for encoding and decoding are described next. Compared to the technique described in WO 2018/145730 A1, a single pass over an incoming data bit string is sufficient when applying methods according to the present disclosure. All necessary position indicators (e.g., first-type, second-type, and possibly third-type), as well as the values of the unpredictable bits (NP bits) are generated during the single pass. This results in better performance (in terms of processing speed).

Moreover, a single counter field in the compressed data packet is sufficient. It is not necessary to provide for separate fields for positive, negative, and absolute counters. This results in more efficient compression.

Also, less bit indicators (flags) are required. In one implementation, only two bit indicators are required: one for indicating that a tracking update is necessary, and one for indicating that counters (position indicators) are present in the counter field of the compressed data packet. This also contributes to a more efficient compression.

On the overall, the proposed technique allows to achieve better compression efficiency. Therein, the increase in performance is concentrated where it is needed, i.e., the worst compression instances show better performance increases than the good ones. Thereby, peaks in the data rate can be avoided.

It is also to be noted that—by virtue of also keeping track of recent updates to the mask bit string—the proposed technique handles short term transitions of bits better than the technique described in WO 2018/145730 A1. Hence, there is less fluctuation in compression efficiency. Also, shorter tracking period can be used, which enables faster adaptation to changing input data.

It should be noted that the method features described above may correspond to respective apparatus features that may not be explicitly described, for reasons of conciseness, and vice versa. The disclosure of the present document is considered to extend also to such apparatus and vice versa.

Accordingly, the present disclosure also relates to an apparatus comprising a processor and a memory coupled to the processor, wherein the processor is configured (e.g., when executing instructions stored in the memory) to perform any one of the methods of encoding or decoding described throughout the disclosure.

Further, the present disclosure also relates to a computer-readable storage medium containing instructions for execution by a processor that cause the processor to perform any one of the methods of encoding or decoding described throughout the disclosure.

It should further be noted that the description and drawings merely illustrate the principles of the proposed method and system. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method and system. Furthermore, all statements herein providing principles, aspects, and embodiments of the invention, as well as specific examples thereof, are intended to encompass equivalents thereof. Thus, in general, the terms used in the following claims should not be construed to limit the claims to the specific embodiments disclosed in the specification and the claims, but should be construed to include all possible embodiments along with the full scope of equivalents to which such claims are entitled.

The invention claimed is:

1. A method of encoding fixed length data bit strings, the method comprising:
  receiving a sequence of data bit strings; and
  sequentially encoding the data bit strings,
    wherein sequentially encoding the data bit strings comprises, for a data bit string immediately following a preceding data bit string in the sequence of data bit strings:
      obtaining a reference bit string for the data bit string, wherein the reference bit string corresponds to said preceding data bit string;
      obtaining a mask bit string and a tracking bit string as present at the end of a previous encoding of the preceding data bit string, wherein the mask bit string is indicative of which bits in the data bit strings are predictable, and which bits in the data bit string are not predictable, in the sense that predictable bits in the data bit string immediately following the preceding data bit string have a high probability of being in the same state as those in the reference bit string, and wherein the tracking bit string is indicative of which bits in the mask bit string have recently changed;
      identifying bits in the data bit string that differ from corresponding bits in the reference bit string;
      determining, as unpredictable bits, all those bits in the data bit string that are indicated as not predictable by the mask bit string and that are not in bit positions indicated by the tracking bit string;
      generating, for those bits among the identified bits that are not among the unpredictable bits, a sequence of position indicators, each position indicator indicating a bit position of a respective bit with respect to a bit position indicated by the preceding position indicator in the sequence of position indicators, such that the position indicators corresponding to bit positions indicated by the tracking bit string are encoded with a reference to the tracking bit string;
      generating an encoded data packet for the data bit string, wherein the encoded data packet includes a representation of values of the unpredictable bits and a representation of the sequence of position indicators; and
      periodically updating the mask bit string and the tracking bit string.

2. The method according to claim 1, wherein the sequence of position indicators includes first-type position indicators relating to the bits among the identified bits that are indicated by the tracking bit string and second-type position indicators relating to bits among the identified bits that are not indicated by the tracking bit string, and wherein the first-type position indicators indicate respective bit positions in terms of a number of set bits in the tracking bit string located between the bit position indicated by the preceding position indicator in the sequence of position indicators and the respective bit position.

3. The method according to claim 1, further comprising:
  maintaining a mask update bit string that indicates, for a current period, all bits in the data bit strings encoded during that period that have been identified as bits that differ from corresponding bits in the respective reference bit strings.

4. The method according to claim 3, further comprising, when updating the mask bit string:
  generating, as part of the sequence of position indicators, one or more third-type position indicators, wherein each third-type position indicator indicates a respective bit within the data bit string that is indicated by the mask bit string and that is not indicated by any of the mask update bit string or the tracking bit string; and
  setting the mask bit string to the mask update bit string.

5. The method according to claim 3, further comprising, when updating the tracking bit string:
  setting the tracking bit string to indicate all those bits that are indicated by the mask bit string but not indicated by the mask update bit string, and to indicate all those bits that are indicated by the mask update bit string but not indicated by the mask bit string.

6. The method according to claim 1, further comprising:
  updating the tracking bit string to also indicate bit positions of the identified bits in the data bit string that differ from corresponding bits in the reference bit string and are not indicated by the mask bit string.

7. A method of sequentially decoding a plurality of encoded data packets into corresponding decoded fixed length data bit strings,
  wherein each encoded data packet corresponds to a data bit string immediately following a preceding data bit string in a sequence of data bit strings and includes a representation of values of unpredictable bits in the respective data bit string and a representation of a sequence of position indicators; and
  wherein sequentially decoding the encoded data packets comprises, for an encoded data packet:
    obtaining a reference bit string for the corresponding data bit string, wherein the reference bit string corresponds to said preceding data bit string;
    obtaining the mask bit string, and the tracking bit string for the encoded data packet as present at the end of a previous decoding of the preceding data bit string, wherein the mask bit sting is indicative of which bits in the data bit strings are predictable, and which bits in the data bit string are not predictable, in the sense that predictable bits in the data bit string immediately following the preceding data bit string have a high probability of being in the same stat as those in the reference bit string, and wherein the tracking bit string is indicative of which bits in the mask bit string have recently changed;
    decoding the sequence of position indicators from the encoded data packet, wherein the position indicators indicate bit positions of difference bits in the respective data bit string that differ from corresponding bits in a reference bit string for the respective data bit string, and wherein each position indicator indicates a bit position of a respective difference bit with respect to a bit position indicated by the preceding position indicator in the sequence of position indicators, wherein position indicators that indicate bit positions of respective difference bits that are indicated by the tracking bit string encode the bit position with reference to the tracking bit string;

decoding the values of the unpredictable bits from the encoded data packet, wherein the unpredictable bits are all those bits in the respective data bit string that are indicated as not predictable by the mask bit string and that are not in bit positons indicated by a tracking bit string;

setting the data bit string to be identical to the reference bit string;

inverting all those bits in the data bit string that are indicated by the position indicators in the sequence of position indicators but not indicated by any of the mask bit string or the tracking bit string;

inverting all those bits in the data bit string that are indicated by the position indicators in the sequence of position indicators and indicated by the tracking bit string;

inserting the values of the unpredictable bits in sequence into the data bit string in respective bit positions indicated by the mask bit string but not indicated by the tracking bit string, unless these bit positions are indicated by position indicators in the sequence of position indicators, wherein bits in respective bit positions of the data bit string are replaced by the values of respective unpredictable bits;

outputting the data bit string; and periodically updating the mask bit string and periodically updating the tracking bit string.

8. The method according to claim 7, further comprising:
updating the tracking bit string to further indicate all those bits whose bit positions are indicated by those position indicators that do not encode the bit position with reference to the tracking bit string.

9. The method according to claim 7, wherein the sequence of position indicators includes first-type position indicators relating to the bits among the difference bits that are indicated by the tracking bit string and second-type position indicators relating to bits among the difference bits that are not indicated by the tracking bit string, and wherein the first-type position indicators indicate respective bit positions in terms of a number of set bits in the tracking bit string located between the bit position indicated by the preceding position indicator in the sequence of position indicators and the respective bit position.

10. The method according to claim 7, further comprising:
updating the mask bit string to further indicate as not predictable all those bits whose bit positions are indicated by the first and second type position indicators.

11. The method according to claim 7, further comprising:
maintaining a mask update bit string that indicates, for a current period, all bits in the data bit strings decoded during that period that have been identified as bits that differ from corresponding bits in the respective reference bit strings.

12. The method according to claim 11, further comprising, when updating the mask bit string:
setting the mask bit string to the mask update bit string.

13. The method according to claim 12, further comprising, when updating the tracking bit string:
setting the tracking bit string to indicate all those bits that are indicated by the mask bit string but not indicated by the mask update bit string, and to indicate all those bits that are indicated by the mask update bit string but not indicated by the mask bit string.

14. The method according to claim 7,
wherein the sequence of position indicators further comprises, when an update of the mask bit string should be performed, one or more third-type position indicators, wherein each third-type position indicator indicates a respective bit position that is also indicated by the mask bit string but is not indicated by the tracking bit string; and the method further comprises updating the mask bit string to indicate all those bits as predictable that are indicated by the third-type position indicators.

15. The method according to claim 14, further comprising, when an update of the mask bit string should be performed:

updating the mask bit string to indicate all those bits as not predictable that are in bit positions indicated by any first-type position indicators or second-type position indicators that have been decoded since the last update of the mask bit string;

updating the mask bit string to indicate all those bits as predictable that are in bit positions indicated by any third-type position indicators that have been decoded since the last update of the mask bit string; and updating the mask bit string to indicate all those bits as predictable that are in bit positions indicated in the tracking bit string but not indicated by any first-type position indicators or second-type position indicators that have been decoded since the last update of the mask bit string.

16. The method according to claim 7, further comprising:
before updating the mask bit string, saving the current mask bit string as a reference mask bit string; and
when updating the tracking bit string, comparing the updated mask bit string to the reference mask bit string and generating the updated tracking bit string to indicate those bits in the updated mask bit string that differ from corresponding bits in the reference mask bit string as bits in the mask bit string that have recently changed.

17. The method according to claim 7, further comprising:
updating the tracking bit string to also indicate bit positions of the difference bits in the data bit string that differ from corresponding bits in the reference bit string.

18. An apparatus comprising a processor and a memory coupled to the processor, the processor being configured to:
receiving a sequence of data bit strings; and
sequentially encoding the data bit strings,
wherein sequentially encoding the data bit strings comprises, for a data bit string immediately following a preceding data bit string in the sequence of data bit strings;
obtaining a reference bit string for the data bit string, wherein the reference bit string corresponds to said preceding data bit string;
obtaining a mask bit string and a tracking bit string as present at the end of a previous encoding of the preceding data bit string, wherein the mask bit string is indicative of which bits in the data bit strings are predictable, and which bits in the data bit string are not predictable, in the sense that predicable bits in the data bit string immediately following the preceding data bit string have a high probability of being in the same state as those in the reference bit string, and wherein the tracking bit string is indicative of which bits in the mask bit string have recently changed;
identifying bits in the data bit string that differ from corresponding bits in the reference bit string;

determining, as unpredictable bits, all those bits in the data bit string that are indicated as not predictable by the mask bit string and that are not in bit positions indicated by the tracking bit string;

generating, for those bits among the identified bits that are not among the unpredictable bits, a sequence of position indicators, each position indicator indicating a bit position of a respective bit with respect to a bit position indicated by the preceding position indicator in the sequence of positon indicators, such that the positon indicators corresponding to bit positions indicated by the tracking bit string are encoded with reference to the tracking bit string;

generating an encoded data packet for the data bit string, wherein the encoded data packet includes a representation of values of the unpredictable bits and a representation of the sequence of position indicators; and periodically updating the mask bit string and the tracking bit string.

19. A non-transitory computer-readable storage medium containing instructions for execution by a computer containing a processor that cause the processor to perform:

receiving a sequence of data bit string;

sequentially encoding the data bit strings, wherein sequentially encoding, the data bit strings comprises, for a data bit string immediately following a preceding data bit string in the sequence of data bit strings;

obtaining, a reference bit string for the data bit string, wherein the reference bit string corresponds to said preceding data bit string;

obtaining a mask bit string and a tracking bit string as present at the end of a previous encoding of the preceding data bit string, wherein the mask bit string is indicative of which bits in the data bit strings are predictable, and which bits in the data bit string are not predictable, in the sense that predicable bits in the data bit string immediately following the preceding data bit string have a high probability of being in the same state as those in the reference bit string, and where the tracking bit string is indicative of which bits in the mask bit string have recently changed;

identifying bits in the data bit string that differ from corresponding bits in the reference bit string;

determining, as unpredictable bits, all those bits in the data bit string that are indicated as not predictable by the mask bit string and that are no in bit positions indicated by the tracking bit string;

generating, for those bits among the identified bits that are no among the unpredictable bits, a sequence a positon indicators, each position indicator indicating a bit position of a respective bit with respect to a bit position indicated by the preceding position indicator in the sequence of position indicators, such that the position indicators corresponding to bit positions indicated by the tracking bit string are encoded with a reference to the tracking bit string;

generating an encoded data packet for the data bit string, wherein the encoded data packet incudes a representation of values of the unpredictable bits and a representation of the sequence of position indicators; and periodically updating the mask bit string and the tracking bit string.

* * * * *

UNITED STATES PATENT AND TRADEMARK OFFICE
CERTIFICATE OF CORRECTION

PATENT NO. : 10,958,286 B2
APPLICATION NO. : 16/794975
DATED : March 23, 2021
INVENTOR(S) : David Evans Page 1 of 1

It is certified that error appears in the above-identified patent and that said Letters Patent is hereby corrected as shown below:

In the Claims

Column 26, Claim 7, Line 49:
"bit sting is" should read: --bit string is--.

Column 26, Claim 7, Line 54:
"same stat as those" should read: --same state as those--.

Column 29, Claim 19, Line 24:
"data bit strings;" should read: --data bit strings; and--.

Column 29, Claim 19, Line 26:
"encoding, the" should read: --encoding the--.

Column 29, Claim 19, Line 30:
"obtaining, a" should read: --obtaining a--.

Column 30, Claim 19, Line 8:
"where the" should read: --wherein the--.

Column 30, Claim 19, Line 15:
"are no in bit" should read: --are not in bit--.

Column 30, Claim 19, Line 18:
"are no among" should read: --are not among--.

Column 30, Claim 19, Lines 18-19:
"a sequence a position" should read: --a sequence of position--.

Signed and Sealed this
Nineteenth Day of March, 2024

Katherine Kelly Vidal
*Director of the United States Patent and Trademark Office*